United States Patent
Seo et al.

(10) Patent No.: US 10,192,860 B2
(45) Date of Patent: Jan. 29, 2019

(54) ENGINEERING CHANGE ORDER (ECO) CELL, LAYOUT THEREOF AND INTEGRATED CIRCUIT INCLUDING THE ECO CELL

(71) Applicant: Samsung Electronics Co., Ltd., Suwon-si, Gyeonggi-do (KR)

(72) Inventors: Jae-woo Seo, Seoul (KR); Dal-hee Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 116 days.

(21) Appl. No.: 15/236,654

(22) Filed: Aug. 15, 2016

(65) Prior Publication Data
US 2017/0116366 A1   Apr. 27, 2017

(30) Foreign Application Priority Data
Oct. 26, 2015   (KR) .................. 10-2015-0148816

(51) Int. Cl.
| | |
|---|---|
| *G06F 17/50* | (2006.01) |
| *H01L 27/00* | (2006.01) |
| *H01L 27/02* | (2006.01) |
| *H01L 27/118* | (2006.01) |
| *H01L 27/11582* | (2017.01) |

(52) U.S. Cl.
CPC ...... *H01L 27/0207* (2013.01); *G06F 17/5018* (2013.01); *G06F 17/5068* (2013.01); *G06F 17/5081* (2013.01); *H01L 27/118* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 6,453,454 B1 | 9/2002 | Lee et al. | |
| 7,137,094 B2 | 11/2006 | Tien | |
| 7,458,051 B2* | 11/2008 | Hou | G11C 5/063 |
| | | | 716/120 |
| 7,683,403 B2 | 3/2010 | Tripathi | |
| 7,698,680 B2 | 4/2010 | Kim | |
| 7,859,024 B2* | 12/2010 | Bosshart | G06F 17/5072 |
| | | | 257/208 |
| 7,919,793 B2* | 4/2011 | Iwata | H01L 27/11807 |
| | | | 257/204 |
| 7,965,107 B2 | 6/2011 | Ciccarelli et al. | |
| 8,015,522 B2* | 9/2011 | Wang | G06F 17/5045 |
| | | | 716/107 |

(Continued)

OTHER PUBLICATIONS

H.-Y. Chang et al., "ECO Optimization Using Metal-Configurable Gate-Array Spare Cells," IEEE Trans. on Computer-Aided Design of ICs and Systems, vol. 32, No. 11, Nov. 2013, pp. 1722-1733.*

(Continued)

*Primary Examiner* — Leigh M Garbowski
(74) *Attorney, Agent, or Firm* — Myers Bigel, P.A.

(57) ABSTRACT

An engineering change order (ECO) base cell and an integrated circuit (IC) including the ECO base cell are provided. The IC includes a plurality of standard cells and at least one engineering change order (ECO) base cell. The ECO base cell has a layout that is generated based on a layout of a functional cell corresponding to a first circuit including a plurality of logic gates.

14 Claims, 26 Drawing Sheets

(56) References Cited

U.S. PATENT DOCUMENTS

| | | | |
|---|---|---|---|
| 8,063,402 B2* | 11/2011 | Sokel | H01L 22/34 |
| | | | 257/48 |
| 8,390,330 B2 | 3/2013 | Ciccarelli et al. | |
| 8,446,176 B1 | 5/2013 | Yang et al. | |
| 8,810,280 B2* | 8/2014 | Pyapali | H03K 19/00384 |
| | | | 326/102 |
| 8,981,494 B2 | 3/2015 | Kwon et al. | |
| 9,280,630 B1* | 3/2016 | Lewis | H03K 19/20 |
| 9,831,230 B2* | 11/2017 | Tien | H01L 27/0207 |
| 2009/0101940 A1* | 4/2009 | Barrows | H03K 19/1778 |
| | | | 257/204 |
| 2014/0264924 A1 | 9/2014 | Yu et al. | |
| 2014/0332979 A1 | 11/2014 | Cicalo et al. | |
| 2015/0048424 A1 | 2/2015 | Tien et al. | |

OTHER PUBLICATIONS

H.-T. Chen et al., "Reconfigurable ECO Cells for Timing Closure and IR Drop Minimization," IEEE Trans. on VLSI Systems, vol. 18, No. 12, Dec. 2010, pp. 1686-1695.*

S.-Y. Fang et al., "Redundant-Wires-Aware ECO Timing and Mask Cost Optimization," 2010 IEEE, pp. 381-386.*

N. A. Modi et al., "ECO-Map:Technology Remapping for Post-Mask ECO Using Simulated Annealing," 2008 IEEE, pp. 652-657.*

I. H.-R. Jiang et al., "ECOS: Stable Matching Based Metal-Only ECO Synthesis," IEEE Trans. on VLSI Systems, vol. 20, No. 3, Mar. 2012, pp. 485-497.*

H.-Y. Chang et al., "Functional ECO Using Metal-Configurable Gate-Array Spare Cells," DAC 2014, 6 pages.*

Ho et al., "ECO Timing Optimization Using Spare Cells and Technology Ramping", IEEE Transaction on Computer-Aided Design of Integrated Circuits and Systems, vol. 29, No. 5, May 2010, pp. 697-710.

* cited by examiner

ENGINEERING CHANGE ORDER (ECO) CELL, LAYOUT THEREOF AND INTEGRATED CIRCUIT INCLUDING THE ECO CELL

REFERENCE TO PRIORITY APPLICATION

This application claims the benefit of Korean Patent Application No. 10-2015-0148816, filed on Oct. 26, 2015, in the Korean Intellectual Property Office, the disclosure of which is hereby incorporated herein in its entirety by reference.

BACKGROUND

The inventive concept relates to an engineering change order (ECO) cell and, more particularly, to an ECO cell, a layout thereof, and an integrated circuit (IC) including the ECO cell.

With developments of semiconductor process technology, transistors have gradually been downscaled, and the number of transistors integrated in a semiconductor device has gradually increased. For example, a system-on chip (SOC) refers to an integrated circuit (IC) in which various components of computer or other electronic systems are integrated in a single chip, and has widely been applied to various small applications. With an increase in performance of applications, a semiconductor device including a larger number of components has been required.

A process of manufacturing a semiconductor device including an IC may include a plurality of process operations. When the IC of the manufactured semiconductor device has functional errors, the IC having corrected functional errors may be redesigned. A process of manufacturing a semiconductor device including the redesigned IC may be reconfigured, and the reconfiguration of the manufacturing process may need considerable costs.

SUMMARY

The inventive concept provides an engineering change order (ECO) cell having high usability, a layout of the ECO cell, and an integrated circuit (IC) including the ECO cell.

The inventive concept also provides a method of generating a layout of an IC using the ECO cell.

According to an aspect of the inventive concept, there is provided an IC including a plurality of standard cells, and at least one ECO base cell. The ECO base cell has a layout that is generated based on a layout of a functional cell corresponding to a first circuit including a plurality of logic gates.

According to another aspect of the inventive concept, there is provided an ECO base cell having a layout obtained by removing a metal layer and/or a via connected to the metal layer from a layout of a functional cell corresponding to a first circuit including a plurality of logic gates.

According to another aspect of the inventive concept, there is provided a layout of an ECO base cell, which is stored in a computer-readable storage medium.

According to additional embodiments of the invention, an integrated circuit device is provided containing a plurality of interconnected standard logic cells, which are distributed within a standard cell region of a substrate (e.g., semiconductor chip). In addition, at least a first engineering change order (ECO) base cell is provided within a spare region of the substrate, which extends adjacent the standard cell region. The first ECO base cell has an in-substrate layout (i.e., diffusion regions, etc. within a semiconductor substrate), which corresponds to an in-substrate layout of a functional logic cell, and an above-substrate layout that extends above a primary surface of the substrate but is incomplete relative to an otherwise corresponding above-substrate layout of the functional logic cell. According to these embodiments of the invention, the above-substrate layout of the first ECO base cell is missing at least one electrically conductive via and/or at least one metal interconnect relative to the above-substrate layout of the functional logic cell. In particular, the first ECO base cell may be configured to be functionally and layout equivalent to the functional logic cell upon addition of the missing at least one electrically conductive via and/or the at least one metal interconnect to the first ECO base cell. According to further aspects of these embodiments, the functional logic cell may be equivalent to a standard logic cell in the plurality of interconnected standard logic cells. In addition, the above-substrate layout of the first ECO base cell includes an electrically insulating via pattern having substantially similar dimensions relative to an electrically conductive via in the above-substrate layout of the functional logic cell. This electrically insulating via pattern may be replaced when the first ECO base cell is ultimately required to function as an active cell.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
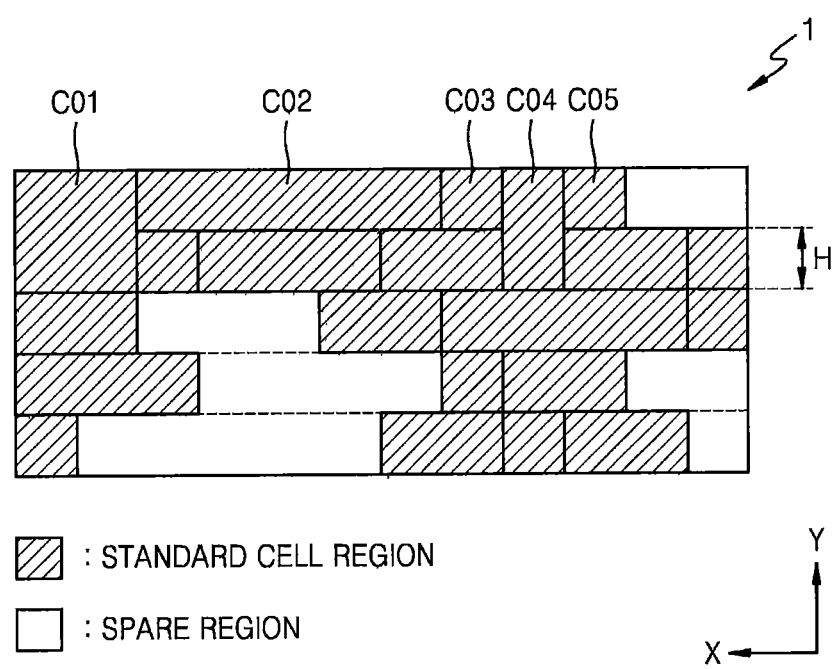
FIG. 1 is a schematic diagram of a portion of a layout of an integrated circuit (IC) according to an exemplary embodiment.

As used herein, the term "and/or" includes any and all combinations of one or more of the associated listed items. Expressions such as "at least one of," when preceding a list of elements, modify the entire list of elements and do not modify the individual elements of the list.

The inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thicknesses of layers and regions are exaggerated for clarity, and proportions of respective components may be exaggerated or reduced. Like numbers refer to like elements throughout.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless explicitly so defined herein.

FIG. 1 is a schematic diagram of a portion of a layout 1 of an integrated circuit (IC) according to an exemplary embodiment. Referring to FIG. 1, the layout 1 of the IC may include a plurality of standard cells (refer to C01 to C05 in FIG. 1). A standard cell may refer to an element of IC, which corresponds to a circuit configured to perform a specific function. A layout of the standard cell may satisfy a predetermined rule. That is, a height of the layout 1 of the standard cell may be a predetermined length or a multiple thereof, and a location of a power supply line may be fixed. For example, as shown in FIG. 1, a Y-axial length of the standard cells C02 to C05 may be H, and a Y-axial length of the standard cell C01 may be 2H. A cell library or a standard cell library may include information of various standard cells, for example, functional information and timing information of the standard cells and topological information of layouts.

A semiconductor design tool may generate the layout 1 of the IC based on data written by a designer to define the IC. For example, a designer may generate data defining behavior of an IC, for example, data described by a hardware description language (HDL), such as a VHSIC HDL (VHDL) and Verilog, and store the data in a computer-readable storage medium. The semiconductor design tool may synthesize data written by a user, by using the cell library, and generate, for example, a bitstream or a netlist. Data, such as the netlist, may include information of the plurality of standard cells and connection relationships of the standard cells. The semiconductor design tool may place the plurality of standard cells based on the netlist, route the standard cells, and generate the layout 1 of the IC. In particular, a semiconductor design tool configured to generate a layout (or layout data) having a format (e.g., a graphic data system II (GDSII)) based on data, such as netlist, may be referred to as a placing and routing (P&R) tool.

The semiconductor design tool may refer to constraints of the layout 1 of the IC, and place and route the plurality of standard cells. For example, the constraints may include a size of the layout I of a final IC provided by the designer, and the semiconductor design tool may refer to the size of the layout 1 of the IC and place and route the standard cells.

As shown in FIG. 1, the layout 1 of the IC generated according to the semiconductor design tool may include a standard cell region and a spare region. The standard cell region may refer to a region in which the standard cells are placed, and the spare region may refer to a region in which the standard cells are not placed. As described below, the spare region may be used for an engineering change order (ECO).

Figure 2:
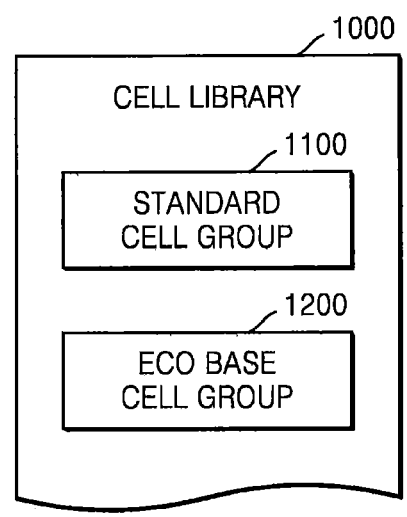
FIG. 2 is a diagram of a cell library according to an exemplary embodiment.

FIG. 2 is a diagram of a cell library 1000 according to an exemplary embodiment. As shown in FIG. 2, the cell library 1000 may include a standard cell group 1100 and an ECO base cell group 1200. The standard cell group 1100 may include information of a plurality of standard cells, and the ECO base cell group 1200 may include information of at least one ECO base cell. A height of the ECO base cell may be equal to a height (i.e., a Y-axial length of FIG. 1) of a standard cell or double the height of the standard cell.

In an exemplary embodiment, the semiconductor design tool may refer to the cell library 1000 and place the ECO base cell in the spare region of the layout 1 of the IC. Thus, a cell placed in the spare region may be referred to as a filler cell. Also, the ECO base cell may be a decoupling capacitor cell electrically connected to a power supply voltage to obtain a stable power supply voltage. The ECO base cell may be placed in the spare region of the layout 1 of the IC. When the IC included in a previously manufactured semiconductor device has functional errors or performance limits, the ECO base cell included in the IC may be reconfigured to correct the functional errors or overcome the performance limits. The reconfiguration of the ECO base cell may be realized by reconfiguring only the ECO base cell and routing the ECO base cell without rearranging the standard cells placed in the standard cell region of the layout I of the IC. Thus, costs taken to redesign the IC and manufacture a semiconductor device including the redesigned IC may be reduced.

As described below, the ECO base cell may be structured such that the reconfigured ECO base cell may implement various functions, and the reconfigured ECO base cell may be changed into a functional cell that may implement a specific function. In particular, a cell having a specific function, which is obtained by reconfiguring the ECO base cell, may be referred to as an ECO functional cell.

The reconfiguration of the ECO base cell may be realized by changing patterns formed in at least one of a plurality of layers included in the layout 1 of the IC. In a semiconductor manufacturing process, the changing of a pattern formed in a specific layer may result in manufacturing at least one new mask. Thus, as the number of layers used to reconfigure the ECO base cell increases, the number of new masks to be manufactured may increase. As a result, costs for manufacturing a semiconductor device including a reconfigured IC may increase. As described below, the ECO base cell may be reconfigured by changing only patterns corresponding to some of the plurality of layers included in the layout 1 of the IC. Also, the ECO base cell may have such a structure as to enable the reconfiguration of the ECO base cell.

Figure 3A:
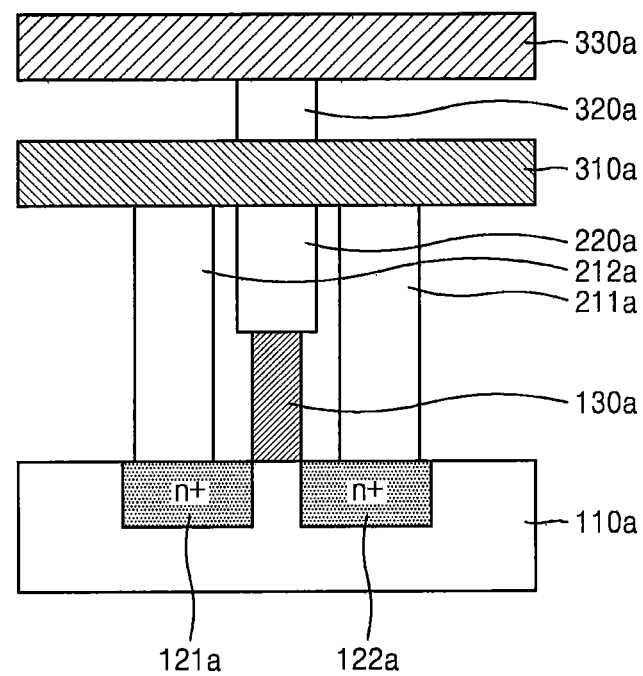
FIGS. 3A and 3B are cross-sectional views of examples of the layout of the IC of FIG. 1.
Figure 3B:
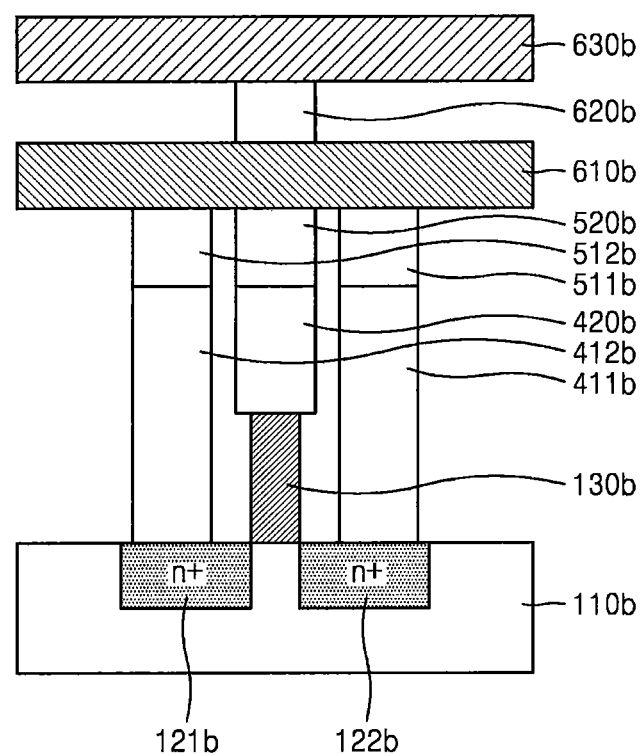

FIGS. 3A and 3B are cross-sectional views of examples of the layout 1 of the IC of FIG. 1. Specifically, FIGS. 3A and 3B illustrate an N-channel metal-oxide semiconductor field-effect transistor (N-channel MOSFET) included in an IC and conductive materials connected to the N-channel MOSFET. In FIGS. 3A and 3B, only elements necessary for convenience of explanation are illustrated, and sizes or thicknesses of respective elements may be exaggerated for clarity. Hereinafter, exemplary embodiments will be described with reference to an N-channel MOSFET. However, it will be understood that a P-channel MOSFET may be applied to exemplary embodiments.

Referring to FIG. 3A, an N-channel MOSFET may include two n+ regions 121a and 122a functioning as a source and a drain, respectively, and a gate poly 130a functioning as a gate. The two n+ regions 121a and 122a may be formed in a substrate 110a (e.g., a p-type substrate), and the gate poly 130a may be placed between the two n+ regions 121a and 122a on the substrate 110a.

Contacts 211a, 212a, and 220a may be formed to electrically connect the source, the drain, and the gate of the N-channel MOSFET to other elements, respectively. Referring to FIG. 3A, the two contacts 211a and 212a may electrically connect the two n+ regions 121a and 122a to the first metal layer 310a (or a M1 layer), and the contact 220a may electrically connect the gate poly 130a to the first metal layer 310a. The first metal layer 310a may be electrically connected to a second metal layer 330a through a via 320a.

In an exemplary embodiment, an ECO base cell may have a structure including an active region and a gate poly. For example, the ECO base cell may have a structure including an n+ regions 121a and 122a and a gate poly 130a and be filled with an insulating material without forming the contacts 211a, 212a, and 220a, the metal layers 310a and 330a, and the via 320. On the other hand, the metal layers 310a and 330a shown in FIG. 3A or metal layers stacked at a higher level than the metal layers 310a and 330a may not be filled with an insulating material on the ECO base cell but include patterns formed by routing the standard cells.

Referring to FIG. 3B, an N-channel MOSFET may include two n+ regions 121b and 122b functioning as a source and a drain, respectively, and a gate poly 130b functioning as a gate. The two n+ regions 121b and 122b may be formed in a substrate 110b (e.g., a p-type substrate), and the gate poly 130b may be placed between the two n+ regions 121b and 122b on the substrate 110b. Contacts 411b, 412b, and 420b may be respectively connected to the source, the drain, and the gate of the N-channel MOSFET. Vias 511b, 512b, and 520b may be formed to electrically connect the contacts 411b, 412b, and 420b to other elements, respectively. As compared with the example shown in FIG. 3A, in the example shown in FIG. 3B, the contacts 411b, 412b, and 420b may be formed as bar types and provide paths through which charges move in a horizontal direction of the layout 1 perpendicular to a direction in which layers are stacked. As shown, the two contacts 411b and 412b may be electrically connected to a first metal layer 610b (or M1 layer) through vias 511b and 512b, respectively, and the contact 420b may be electrically connected to the first metal layer 610b through the via 520b. The first metal layer 610b may be electrically connected to a second metal layer 630b through a via 620b.

In an exemplary embodiment, an ECO base cell may have a structure including an active region, a gate poly, and a contact. For example, the ECO base cell may have a structure including n+ regions 121b and 122b, a gate poly 130b, and contacts 411b, 412b, and 420b, and be filled with an insulating material without forming vias 511b, 512b, 520b, and 620b and metal layers 610b and 630b. On the other hand, the first and second metal layers 610b and 630b shown in FIG. 3B or metal layers stacked at a higher level than the metal layers 610b and 630b may not be filled with an insulating material on the ECO base cell but include patterns formed due to the routing of the standard cells.

As described above with reference to FIGS. 3A and 3B, in an exemplary embodiment, the ECO base cell may have a structure in which one or more metal layers and vias connected to the metal layers are omitted. Thus, in a process of redesigning the IC, a designer or a semiconductor design tool may reconfigure the ECO base cell by defining patterns of metal layers and vias in the ECO base cell in which shapes (i.e., the active regions and gate polys of FIG. 3A or the active regions, the gate polys, and contacts of FIG. 3B) corresponding to some layers are defined. As a result, masks used to form the previously defined shapes in the ECO base cell may be reused during a process of a semiconductor device including the redesigned IC. The ECO base cell according to the present embodiment may reduce costs for manufacturing the semiconductor device including the redesigned IC and have a layout formed based on a layout of a complex circuit as described above. Thus, the ECO base cell according to the present embodiment may have high usability, thereby improving performance of the redesigned IC.

Figure 4A:
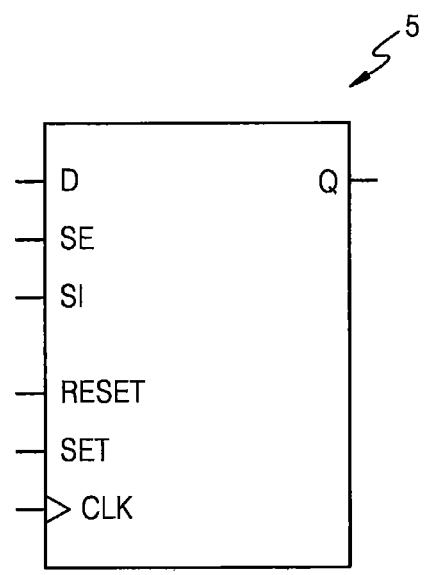
FIG. 4A is a block diagram of a flip-flop according to an exemplary embodiment.
Figure 4B:
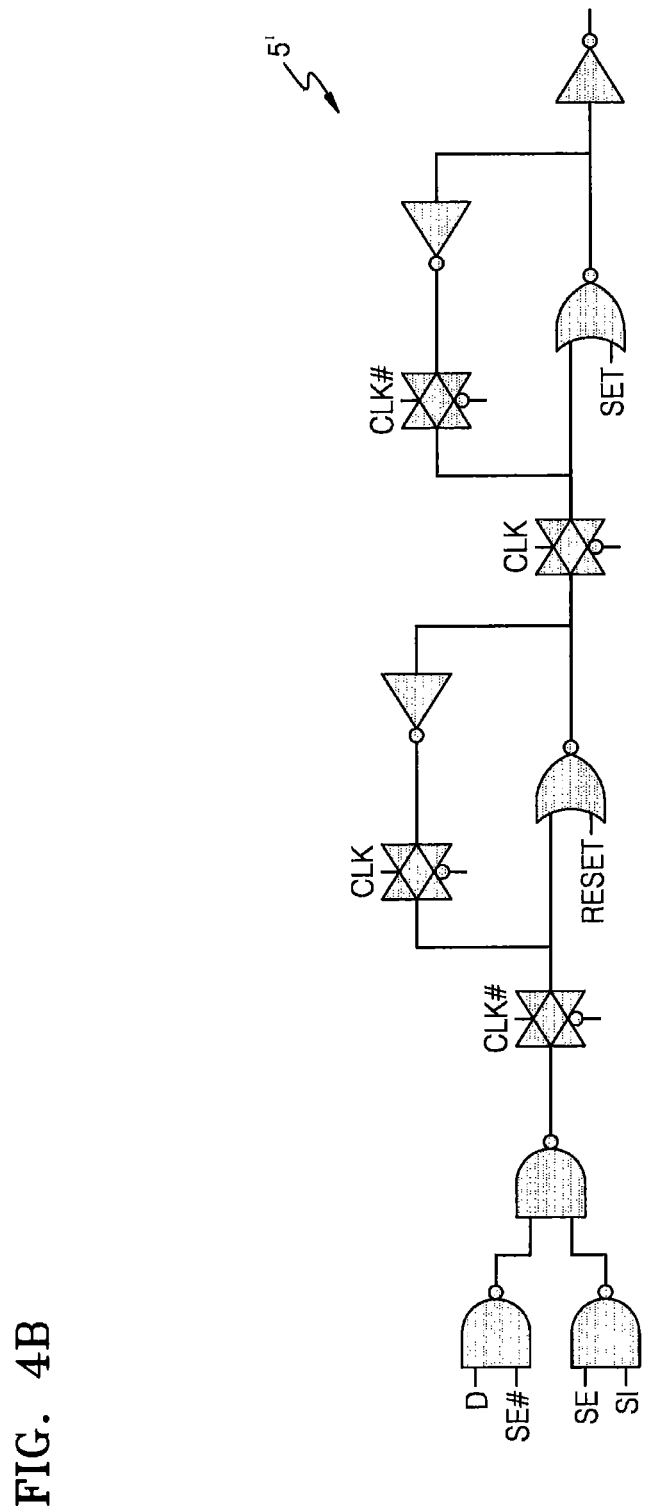
FIG. 4B is a logic diagram of an example of the flip-flop of FIG. 4A.

FIG. 4A is a block diagram of a flip-flop 5 according to an exemplary embodiment, and FIG. 4B is a logic diagram of an example 5' of the flip-flop 5. In an exemplary embodiment, an ECO base cell may have a layout formed based on a layout of a functional cell (e.g., a standard cell) corresponding to a first circuit including a plurality of logic gates. For example, the ECO base cell may have a layout in which a metal layer or a via connected to the metal layer is removed from the layout of the functional cell corresponding to the first circuit including the plurality of logic gates. The first circuit including the plurality of logic gates may be a sequential circuit or a combinational circuit. For example, non-limiting examples of the first circuit including the plurality of logic circuits may be a flip-flop, a latch, a multiplexer, an adder, or an XOR gate. Hereinafter, the flip-flop 5 will be taken as an example of the first circuit including the plurality of logic gates, but the inventive concept is not limited thereto.

Referring to FIG. 4A, the flip-flop 5 may have six inputs D, SE, SI, RESET, SET, and CLK and one output Q. When a signal applied to each of a scan enable input SE, a reset input RESET, and a set input SET is in an inactive state (e.g., at a low level), a signal applied to a data input D may be output to a data output Q at a rising edge of a signal applied to a clock signal CLK. Meanwhile, when a signal applied to the scan enable input SE is in an active state (e.g., at a high level) and a signal applied to each of the reset input RESET and the set input SET is in an inactive state, a signal applied to the scan data input SI may be output to the data output Q at the rising edge of the signal applied to the clock input CLK. When a signal applied to the reset input RESET is in an active state, the data output Q may output an inactive signal (e.g., a low-level signal). When a signal applied to the set input SET) is in an inactive state, the data output Q may output an active signal (e.g., a high-level signal).

Referring to FIG. 4B, a flip-flop 5' may include twelve logic gates. That is, the flip-flop 5' may include three NAND gates, two NOR gates, three inverters, and four pass gates, which may be connected to one another as shown in FIG. 4B. As described below with reference to FIGS. 5A to 5C, an ECO base cell may correspond to a circuit obtained by removing at least some of lines connecting the logic gates from the logic diagram of the flip-flop 5'. Also, as described below with reference to FIGS. 6C to 11B, during the redesigning of the IC, when the ECO base cell is reconfigured to perform a required function, a designer or a semiconductor design tool may connect desired logic gates included in the ECO base cell to one another or reconfigure a layout corresponding to the logic gates.

As shown in FIG. 4B, each of the pass gates may have two control inputs that are complementary to each other. In the following drawings, only one signal applied to one of the two control inputs of each of the pass gates is illustrated. However, it will be understood that an inverted signal of the applied signal may be applied to the remaining control input.

Figure 5A:
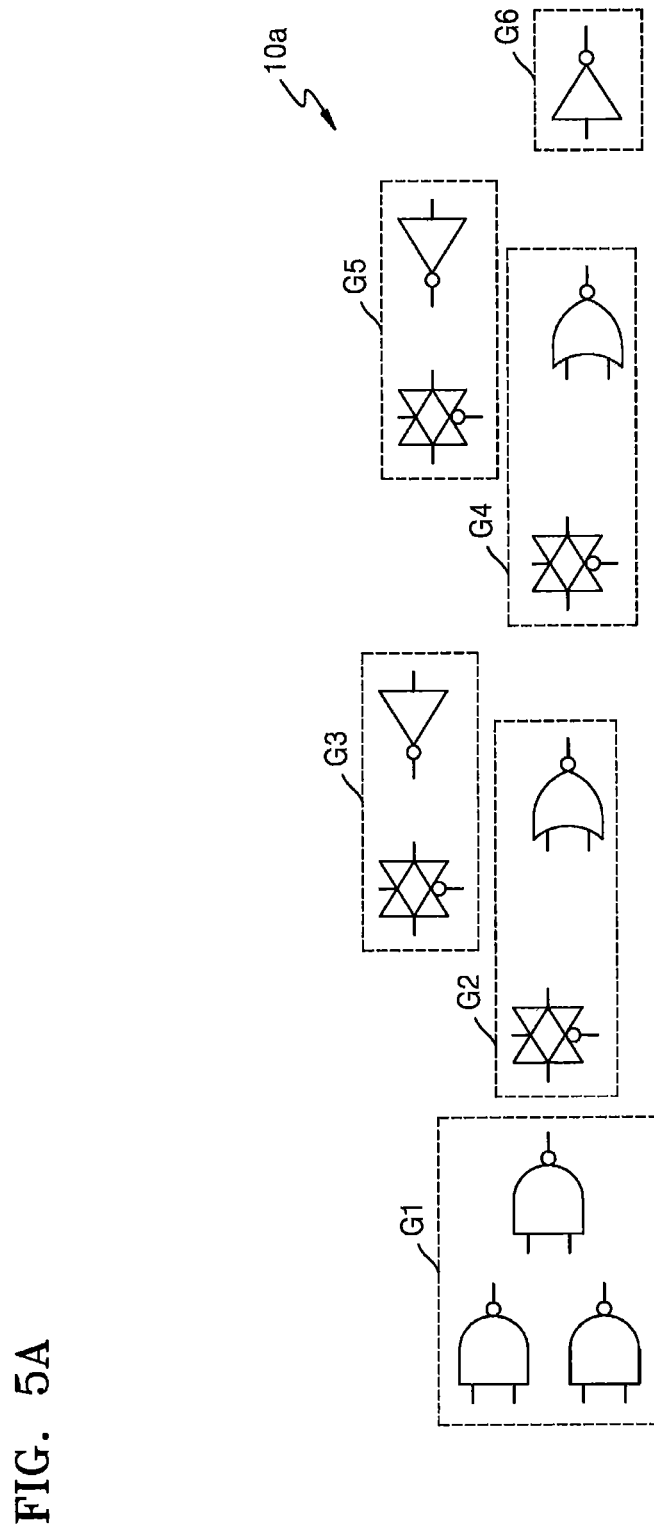
FIG. 5A is a logic diagram of a circuit corresponding to an engineering change order (ECO) base cell according to an exemplary embodiment.
Figure 5B:
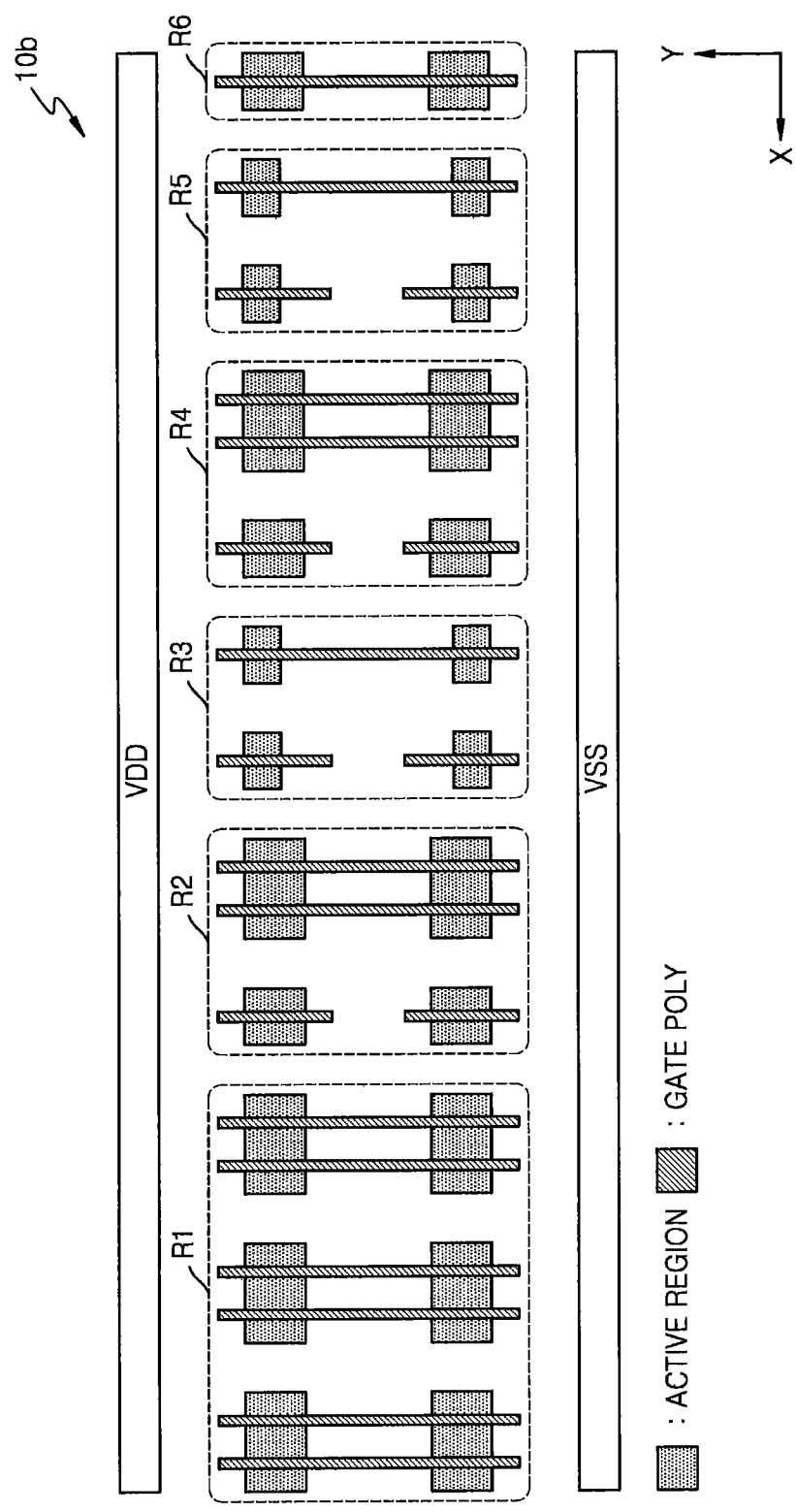
FIGS. 5B to 5D respectively illustrate examples of a layout of the ECO base cell of FIG. 5A.
Figure 5C:
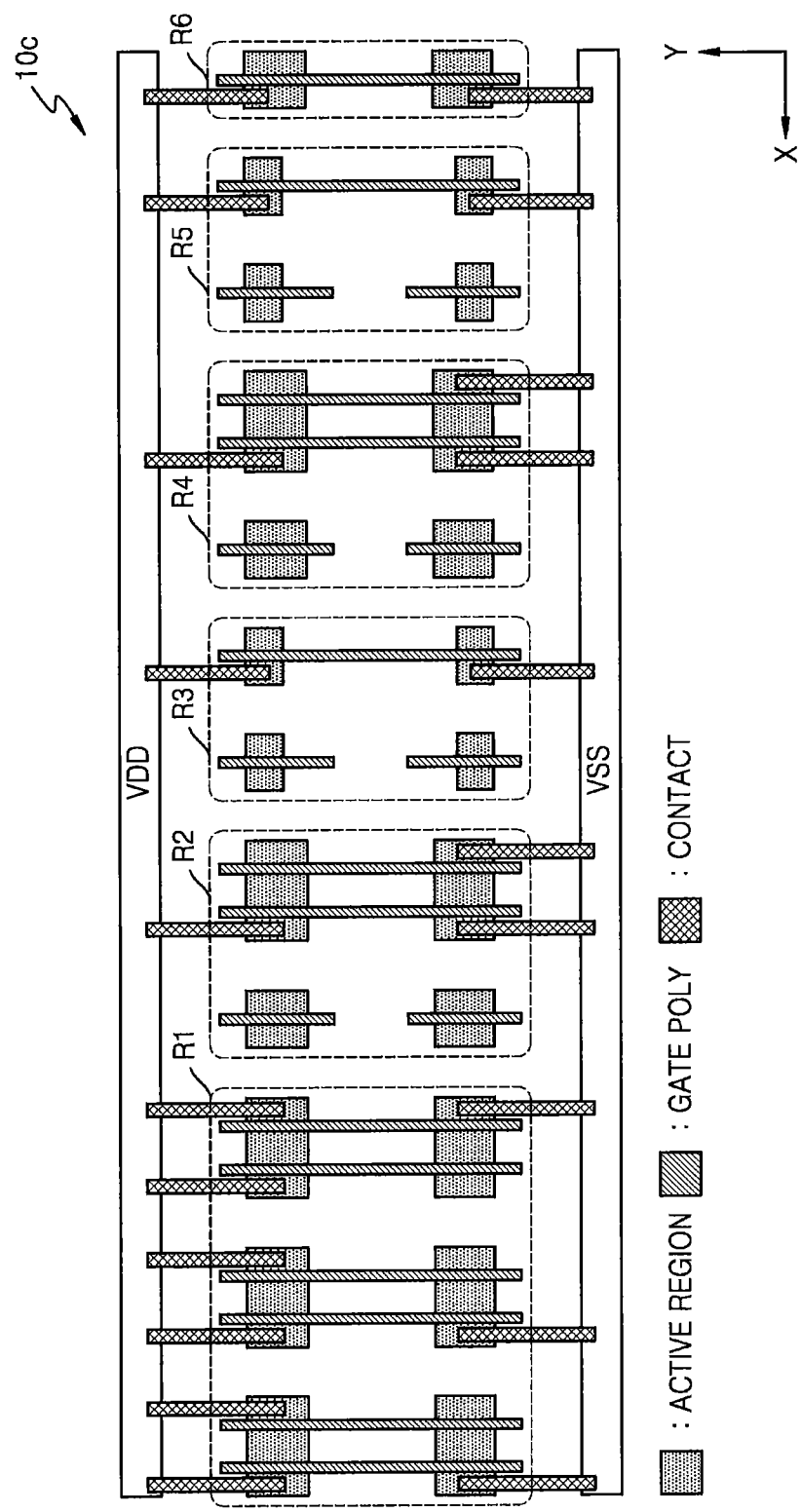
Figure 5D:
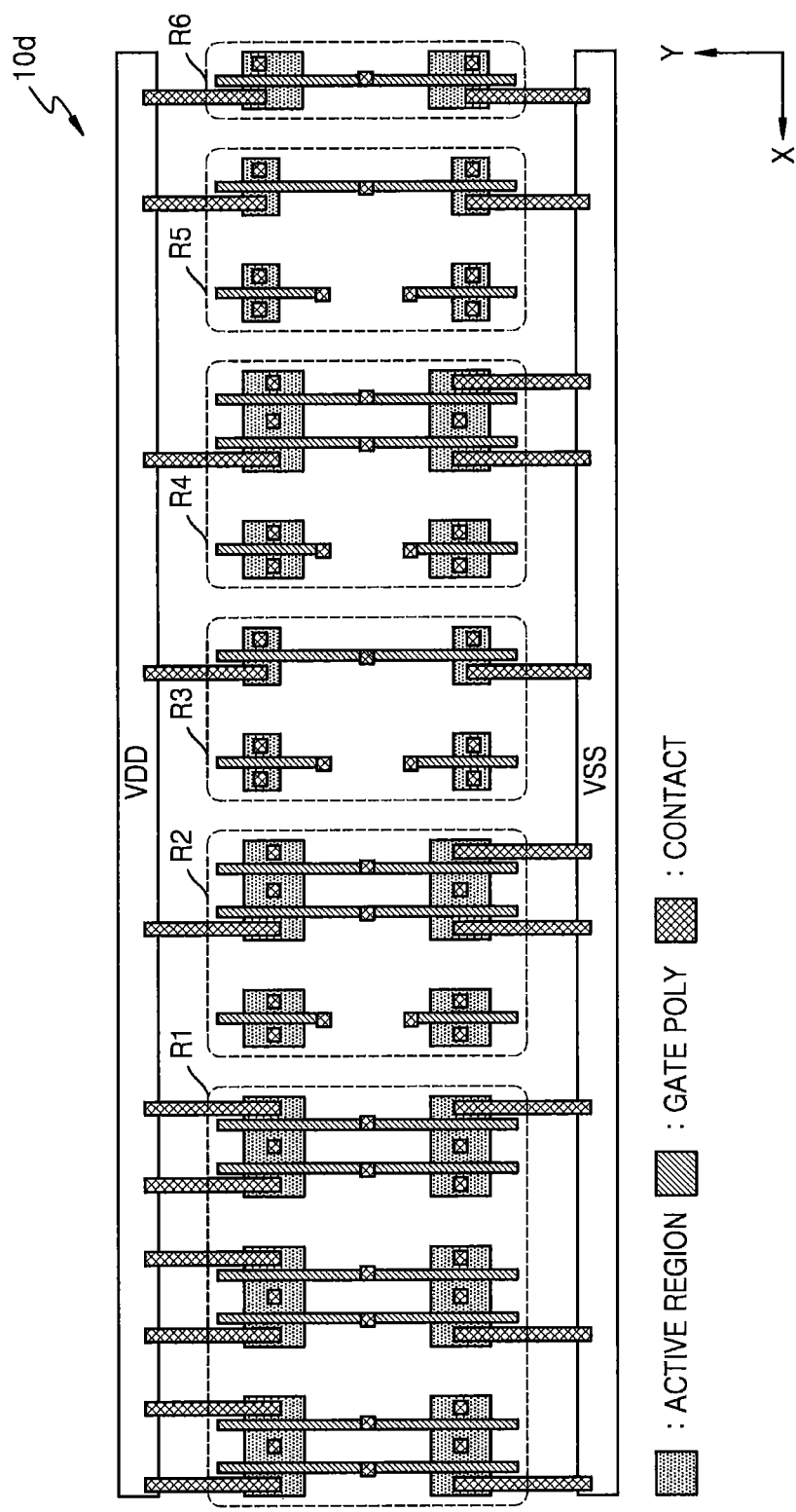

FIG. 5A is a logic diagram of a circuit 10a corresponding to an ECO base cell according to an exemplary embodiment. FIGS. 5B to 5D respectively illustrate examples 10b, 10c, and 10d of a layout of an ECO base cell. Specifically, FIGS. 5A to 5D respectively illustrate the circuit 10a, which corresponds to the ECO base cell generated based on the flip-flop 5' shown in FIG. 4B, and the layouts 10b, 10c, and 10d.

As shown in FIG. 5A, the ECO base cell may correspond to a circuit configured by removing lines configured to connect logic gates from the logic diagram of the flip-flop 5'. Thus, the ECO base cell may provide a plurality of logic gates and have high usability. For example, during a process of redesigning an IC, when it is intended to add the flip-flop 5 shown in FIG. 4a, a designer or a semiconductor design tool may reconfigure the ECO base cell to be the same as a functional cell corresponding to the flip-flop 5. As compared with a flip-flop generated by reconfiguring a plurality of ECO base cells having regular or symmetrical layouts, the flip-flop generated by reconfiguring the ECO base cell according to the present embodiment may have improved characteristics, for example, a reduced delay time and a reduced area.

A plurality of logic gates provided by the ECO base cell may be individually used. Alternatively, at least two of the logic gates may be connected to one another and implement a desired function. Thus, as compared with an ECO base cell that is designed with excess flexibility in consideration of multiple implementations, the ECO base cell according to the present embodiment may provide a plurality of optimized logic gates, and the circuit 10a corresponding to the reconfigured ECO base cell may have high performance.

Referring to FIG. 5A, the circuit 10a corresponding to the ECO base cell may include a plurality of groups, for example, first to sixth groups G1 to G6, each of which may include at least one gate. The first to sixth groups G1 to G6 may respectively correspond to a plurality of regions, for example, first to sixth regions R1 to R6, each of which includes at least one transistor, in FIGS. 5B and 5C.

As described above with reference to FIG. 3A, FIG. 5B illustrates a layout 10b of an ECO base cell having a structure in which an active region and a gate poly are defined. As shown in FIG. 5B, contacts, metal layers, and vias may be omitted in the layout 10b of the ECO base cell. As shown in FIG. 5B, the layout 10b of the ECO base cell may include at least three gate lines (i.e., lines having gate polys). Also, the layout 10b of the ECO base cell may be asymmetrical with respect to a line parallel to an X-axis and/or a line parallel to a Y-axis. The layout 10b of the ECO base cell may have a length H in a Y-axial direction.

As described above with reference to FIG. 3B, FIG. 5C illustrates a layout 10c of an ECO base cell having a structure in which active regions, gate polys, and portions of contacts are defined. As shown in FIG. 5C, metal layers, vias, and portions of contacts may be omitted in the layout 10c of the ECO base cell.

As described above with reference to FIG. 3B, a contact may be formed as a bar type and provide a path through which charges moves in a horizontal direction of the layout 10c perpendicular to a direction in which layers are stacked. That is, referring to FIG. 5C, the layout 10c of the ECO base cell may include bar-type contacts configured to connect sources or drains of transistors respectively included in a plurality of logic gates to power supply voltages VDD and VSS. Also, although not shown in FIG. 5C, the layout 10c of the ECO base cell may further include contacts configured to electrically connect sources and drains to one another without using vias or metal layers. For example, to form an inverter included in the sixth group G6 of FIG. 5A, a bar-type contact may be formed by electrically connecting a drain of a P-channel MOSFET and a drain of an N-channel MOSFET included in the sixth region R6 of FIG. 5C.

FIG. 5D illustrates a layout 10d of an ECO base cell in which active regions, gate polys, and contacts are defined as described above with reference to FIG. 3B. As shown in FIG. 5D, metal layers and vias may be omitted in the layout 10d of the ECO base cell. That is, the layout 10c of FIG. 5C may include only bar-type contacts connected to a power supply voltage, while the layout 10d of FIG. 5D may further include contacts connected to signal nodes. Thus, an ECO function cell may be formed by adding only the vias and/or the metal layers to the layout 10d of the ECO base cell.

Hereinafter, exemplary embodiments will be described below with reference to the layout 10b of the ECO base cell of FIG. 5B. However, the inventive concept is not limited thereto. That is, it will be understood that the ECO base cell according to the embodiments may have a layout including shapes defined in at least one of a plurality of layers included in the layout 1 of the IC instead of the layout 10c 100o shown in FIG. 5C.

Figure 6A:
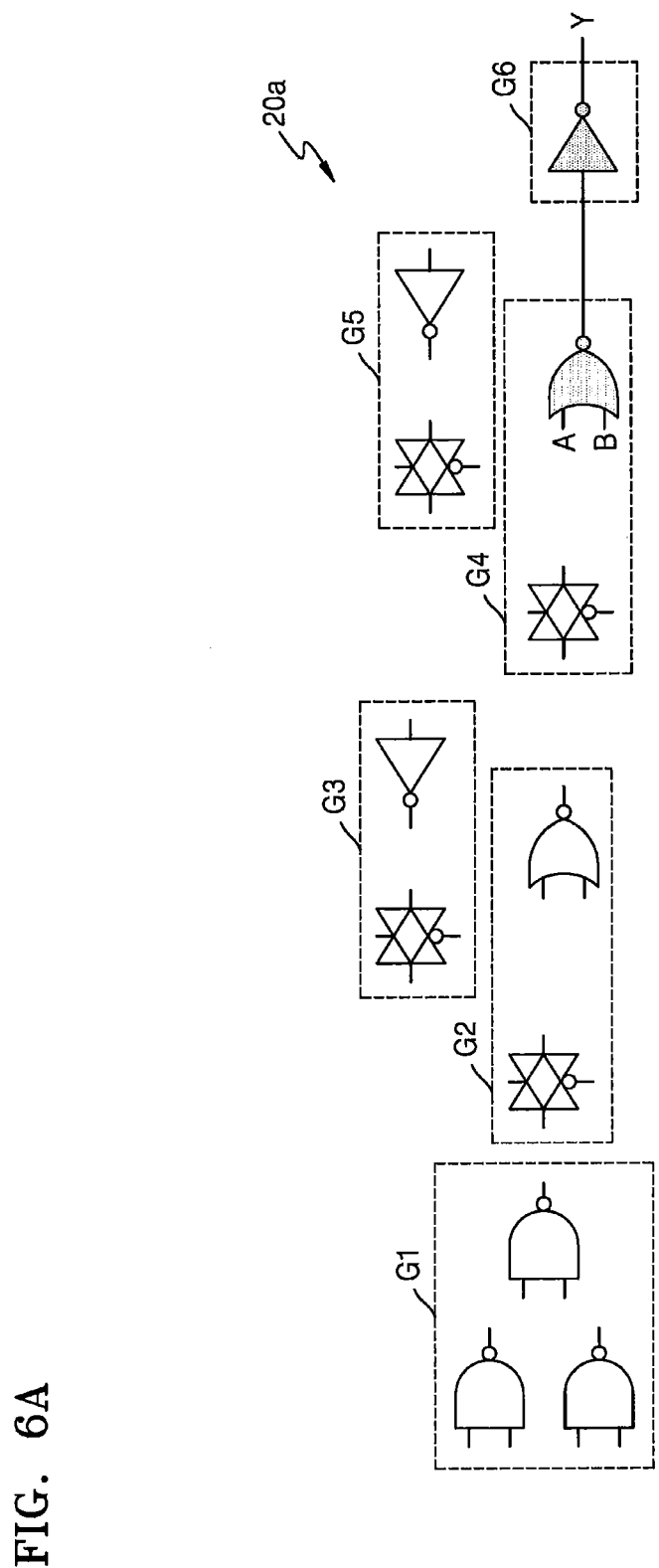
FIGS. 6A and 6B are respectively a logic diagram and layout diagram of an ECO functional cell that is reconfigured with an OR gate.
Figure 6B:
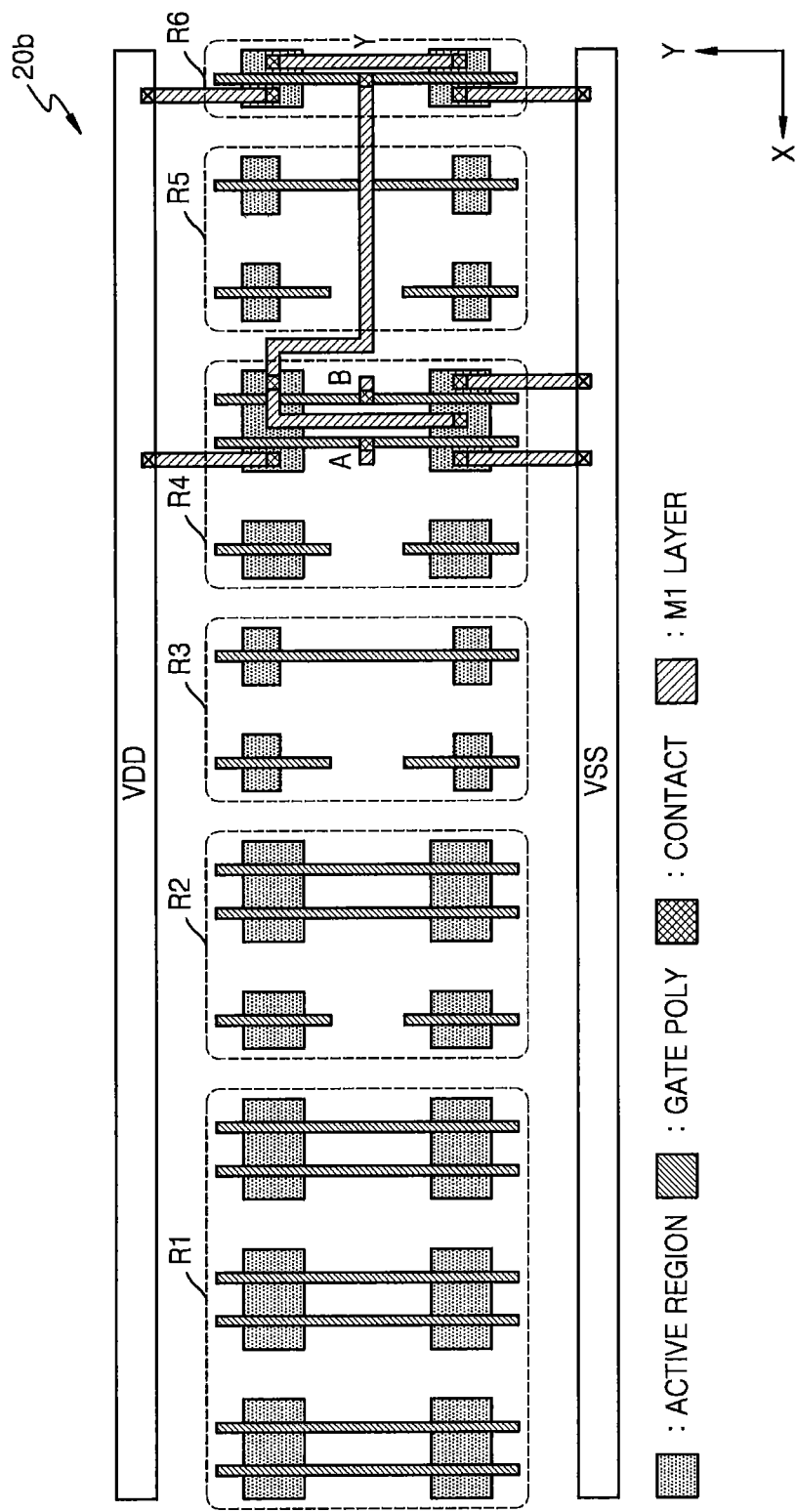

FIGS. 6A and 6B are respectively a logic diagram and layout diagram of an ECO functional cell that is reconfigured with an OR gate. Specifically, FIGS. 6A and 6B are respectively a logic diagram and layout diagram of an ECO functional cell obtained by reconfiguring the ECO base cell of FIGS. 5A and 5B. As shown in FIG. 6A, in a circuit 20a corresponding to an ECO functional cell, an OR gate may be implemented by connecting a NOR gate included in a fourth group G4 with an inverter included in a sixth group G6. On the other hand, an OR gate may be implemented by connecting a NOR gate included in a second group G2 with an inverter included in a third group G3 or connecting the NOR gate included in the fourth group G4 with an inverter included in the fifth group G5.

As shown in FIG. 6B, a layout 20b of a functional cell corresponding to an OR gate having two inputs A and B and an output Y may be formed by forming contacts, vias, and patterns of a first metal layer in the layout 10b of the ECO base cell of FIG. 5B. The layout 20b shown in FIG. 6B may be only an example, and a layout corresponding to the OR gate may be formed by differently forming contacts, vias, and patterns of a first metal layer from those of FIG. 6B.

Figure 7A:
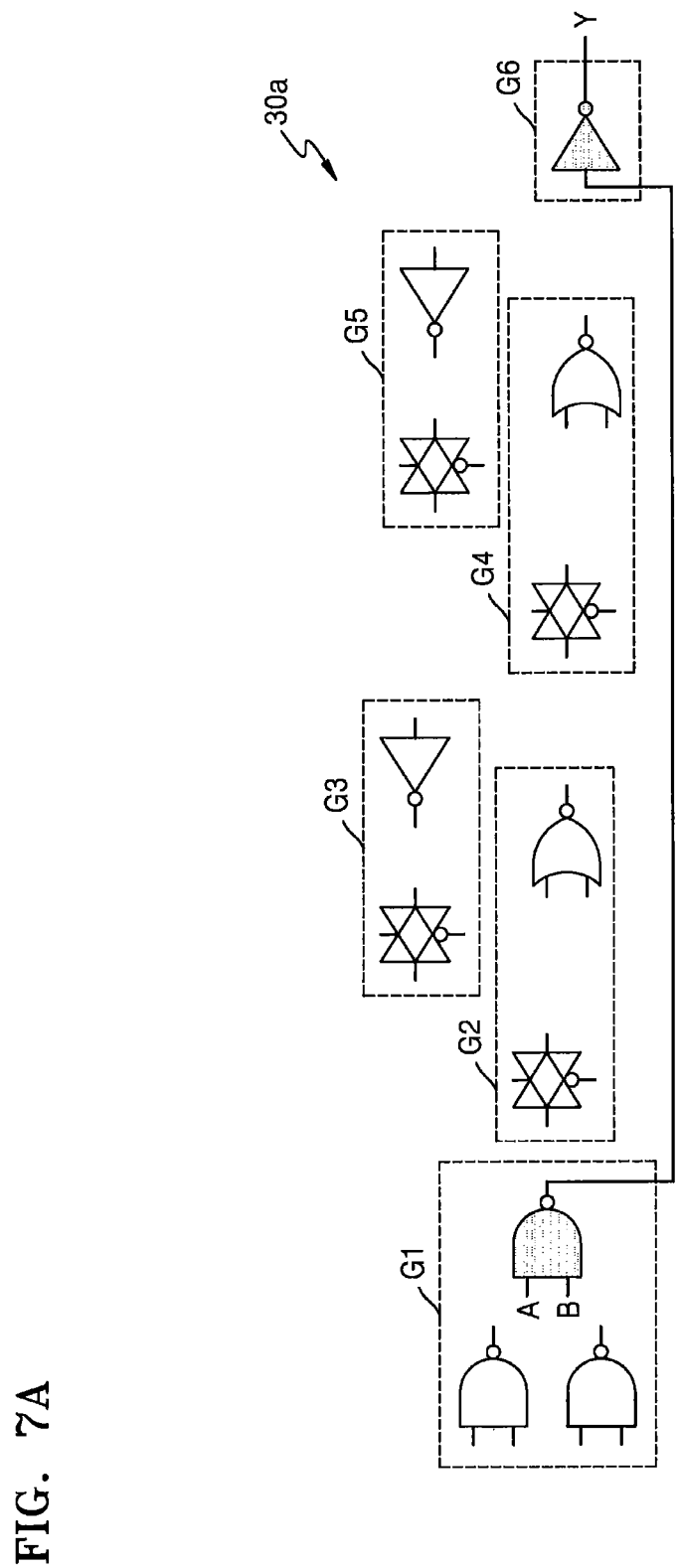
FIGS. 7A to 7C are respectively a logic diagram and layout diagrams of an ECO functional cell that is reconfigured with an AND gate.
Figure 7B:
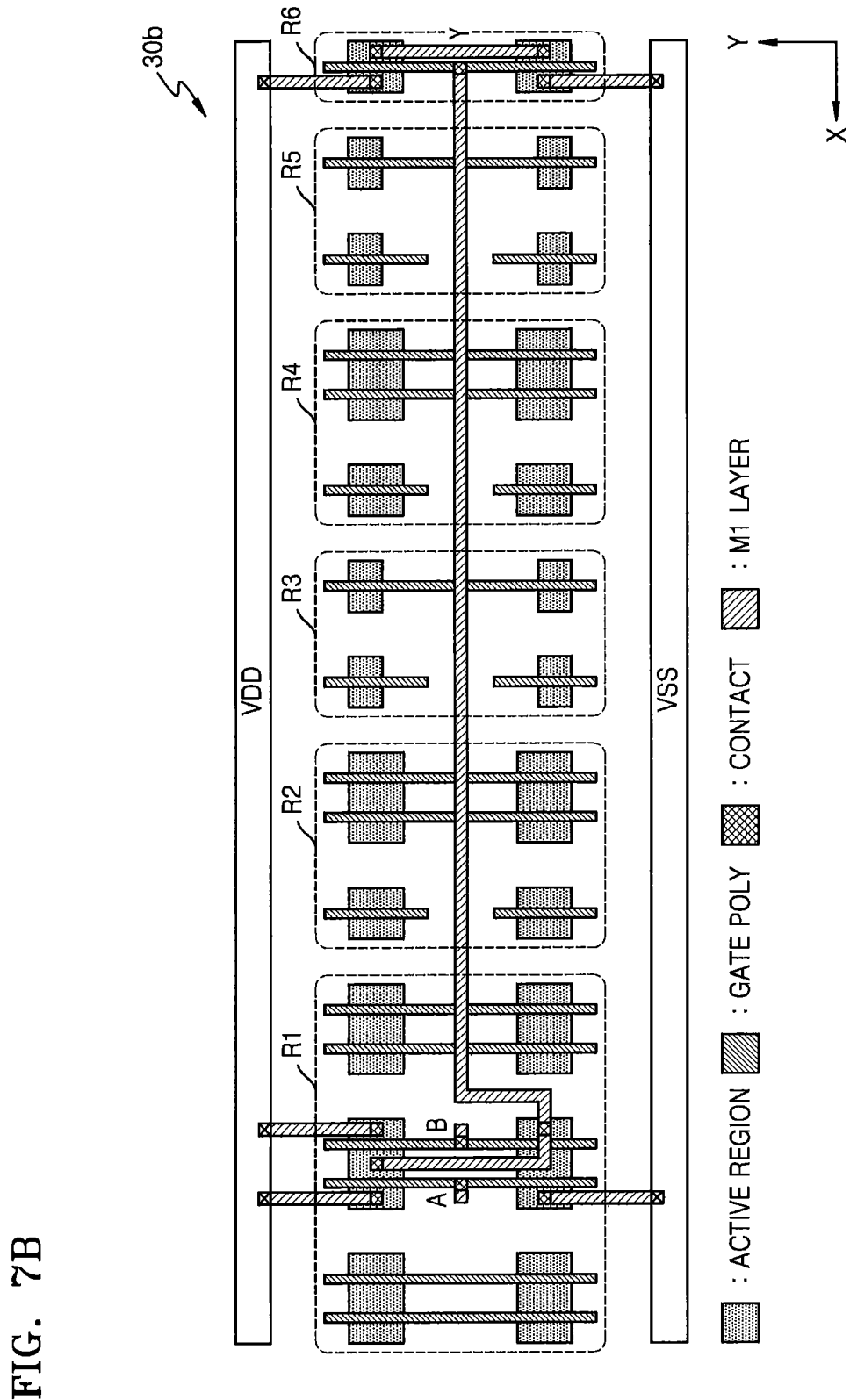
Figure 7C:
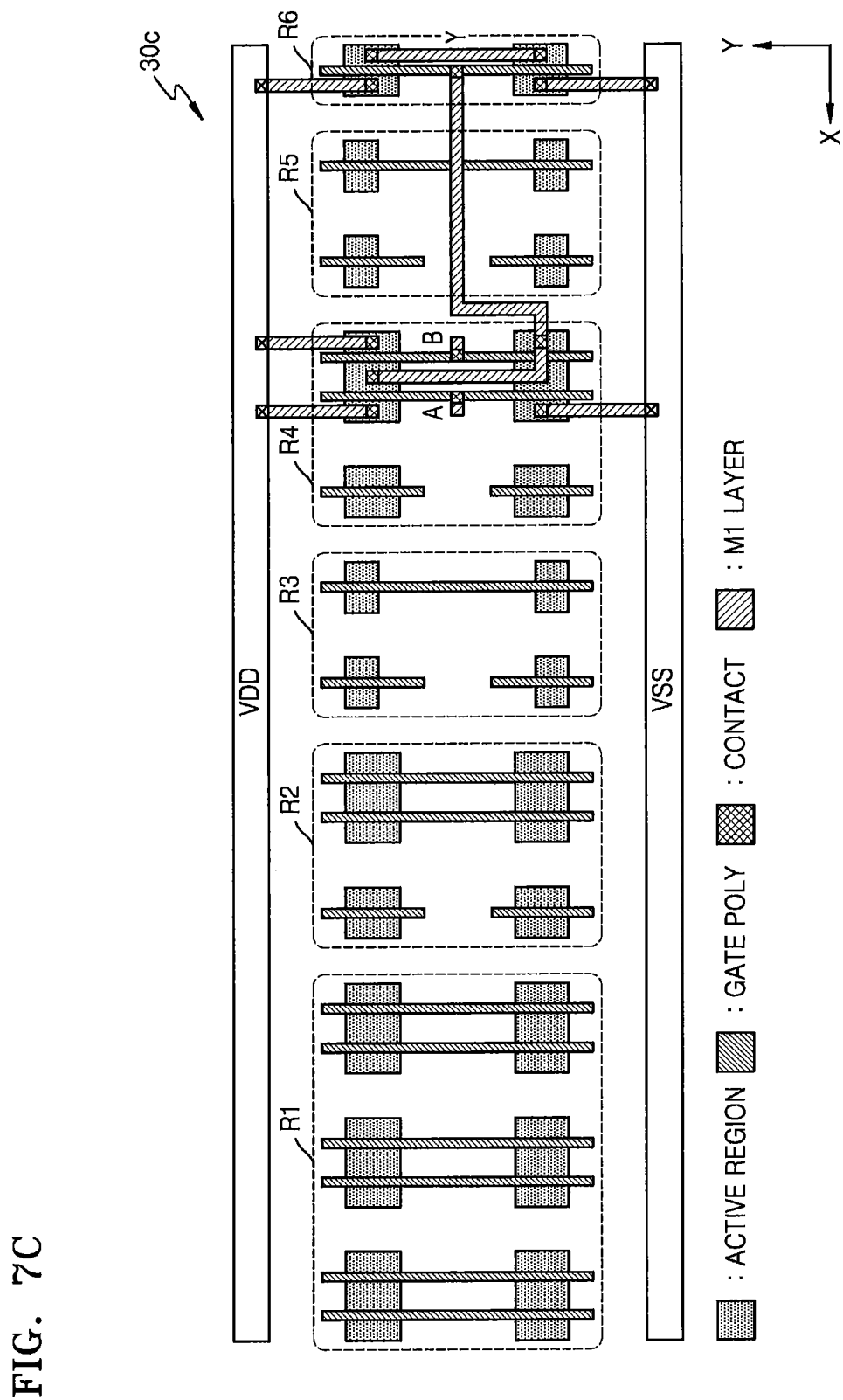

FIGS. 7A to 7C are a logic diagram and layout diagrams of an ECO functional cell that is reconfigured with an AND gate. Specifically, FIGS. 7A and 7B are respectively a logic diagram and layout diagram of an ECO functional cell obtained by reconfiguring the ECO base cell of FIGS. 5A and 5B. As shown in FIG. 7A, in a circuit 30a corresponding to a reconfigured ECO functional cell, an AND gate may be implemented by connecting a NAND gate included in a first group G1 with an inverter included in a sixth group G6. On the other hand, an AND gate may be implemented by connecting the NAND gate included in the first group G1 with an inverter included in a third group G3 or an inverter included in a fifth group G5.

As shown in FIG. 7B, a layout 30b of an ECO functional cell corresponding to an AND gate having two inputs A and B and an output Y may be formed by forming contacts, vias, and patterns of a first metal layer in the layout 10b of the ECO base cell of FIG. 5B. The layout 30b shown in FIG. 7B may be only an example, and a layout corresponding to the AND gate may be formed by differently forming contacts, vias, and patterns of a first metal layer from those of FIG. 7B.

As shown in FIG. 7C, a logic gate configured to perform a different function from the logic gate shown in FIG. 5A may be formed by forming contacts, vias, and patterns of a first metal layer in the layout 10b of the ECO base cell of FIG. 5B. That is, referring to FIGS. 7A and 7C, transistors of a fourth region R4 corresponding to a NOR gate included in a fourth group G4 may be routed and function as NAND gates. Thus, a distance by which a signal moves from an output of a NAND gate to an input of an inverter in the layout 30c of FIG. 7C may be shorter than a distance by which a signal moves from an output of a NAND gate to an input of an inverter in the layout 30b of FIG. 7B. As a result, a signal delay may be reduced.

Figure 8A:
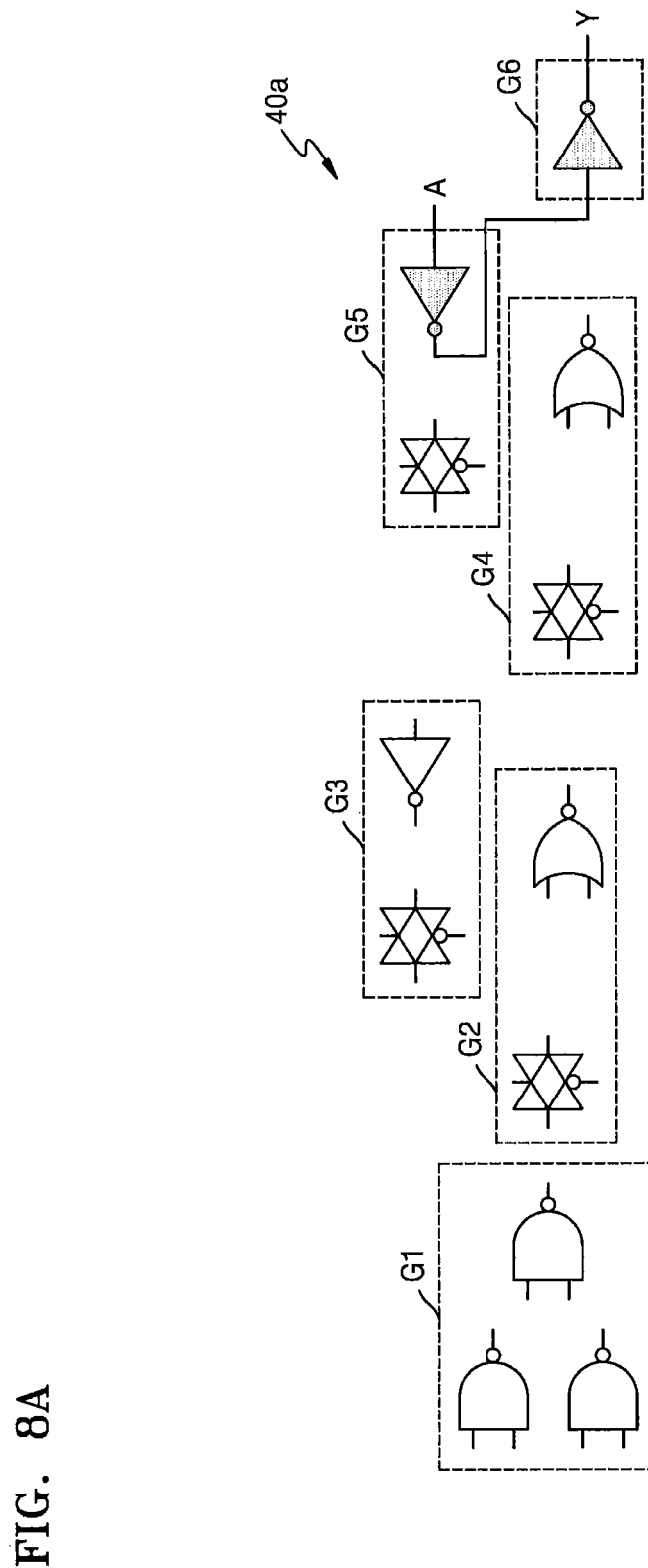
FIGS. 8A and 8B are respectively a logic diagram and layout diagram of an ECO functional group that is reconfigured with a buffer.
Figure 8B:
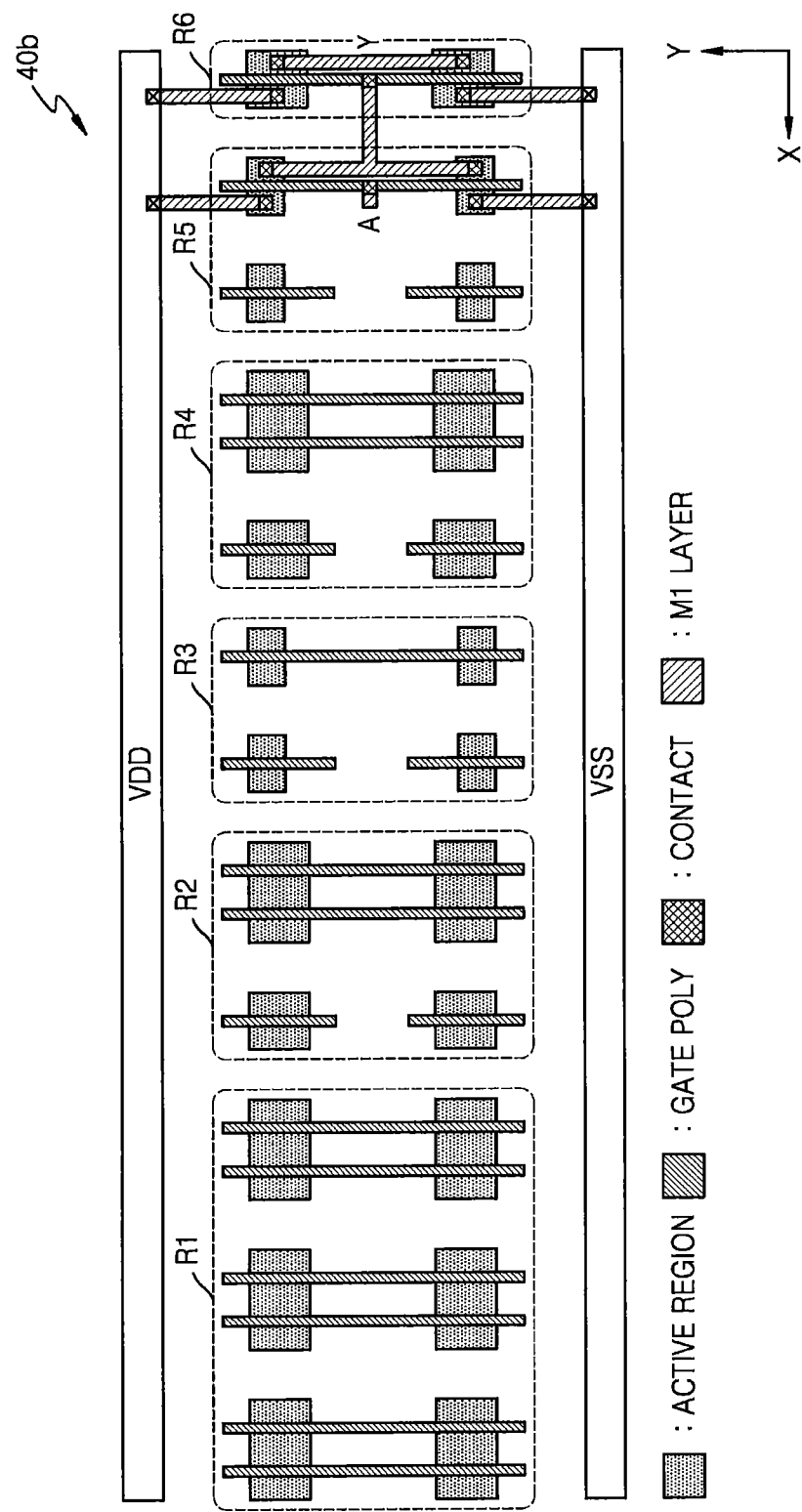

FIGS. 8A and 8B are respectively a logic diagram and layout diagram of an ECO functional cell reconfigured with a buffer. Specifically, FIGS. 8A and 8B are respectively a logic diagram and layout diagram of an ECO functional cell obtained by reconfiguring the ECO base cell of FIGS. 5A and 5B.

As shown in FIG. 8A, in a circuit 40a corresponding to a reconfigured ECO functional cell, a buffer may be implemented by connecting an inverter included in a fifth group G5 with an inverter included in a sixth group G6. On the other hand, a buffer may be implemented by connecting an inverter included in a third group G3 with the inverter included in the fifth group G5 or the inverter included in the sixth group G6.

As shown in FIG. 8B, a layout 40b of a functional cell corresponding to a buffer having an input A and an output Y may be formed by forming contacts, vias, and patterns of a first metal layer in the layout 10b of the ECO base cell of FIG. 5B. The layout 40b shown in FIG. 8B may be only an example, and a layout corresponding to the buffer may be formed by differently forming contacts, vias, and patterns of a first metal layer from those of FIG. 8B.

Figure 9A:
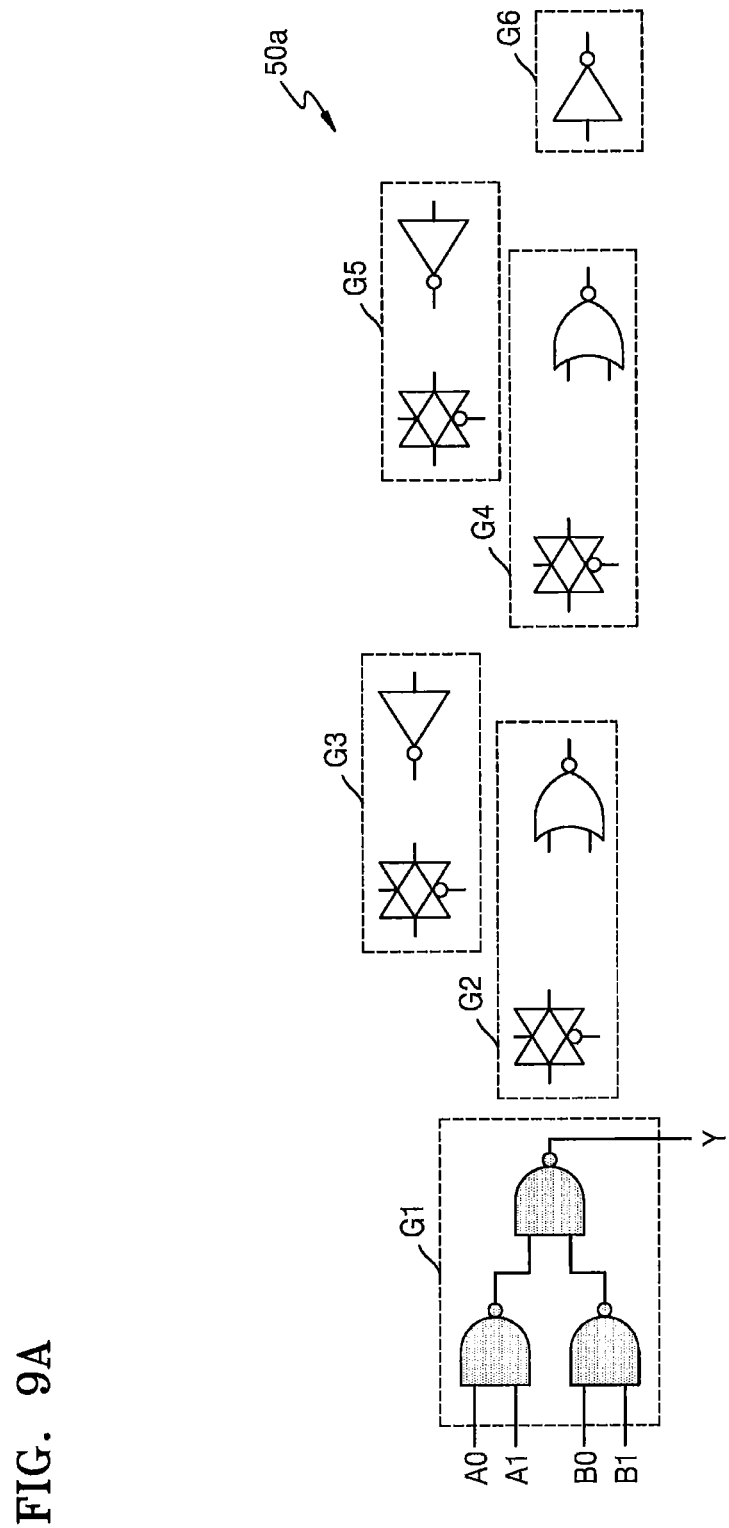
FIGS. 9A and 9B are respectively a logic diagram and layout diagram of an ECO functional cell that is reconfigured with an AND-OR (AO) gate.
Figure 9B:
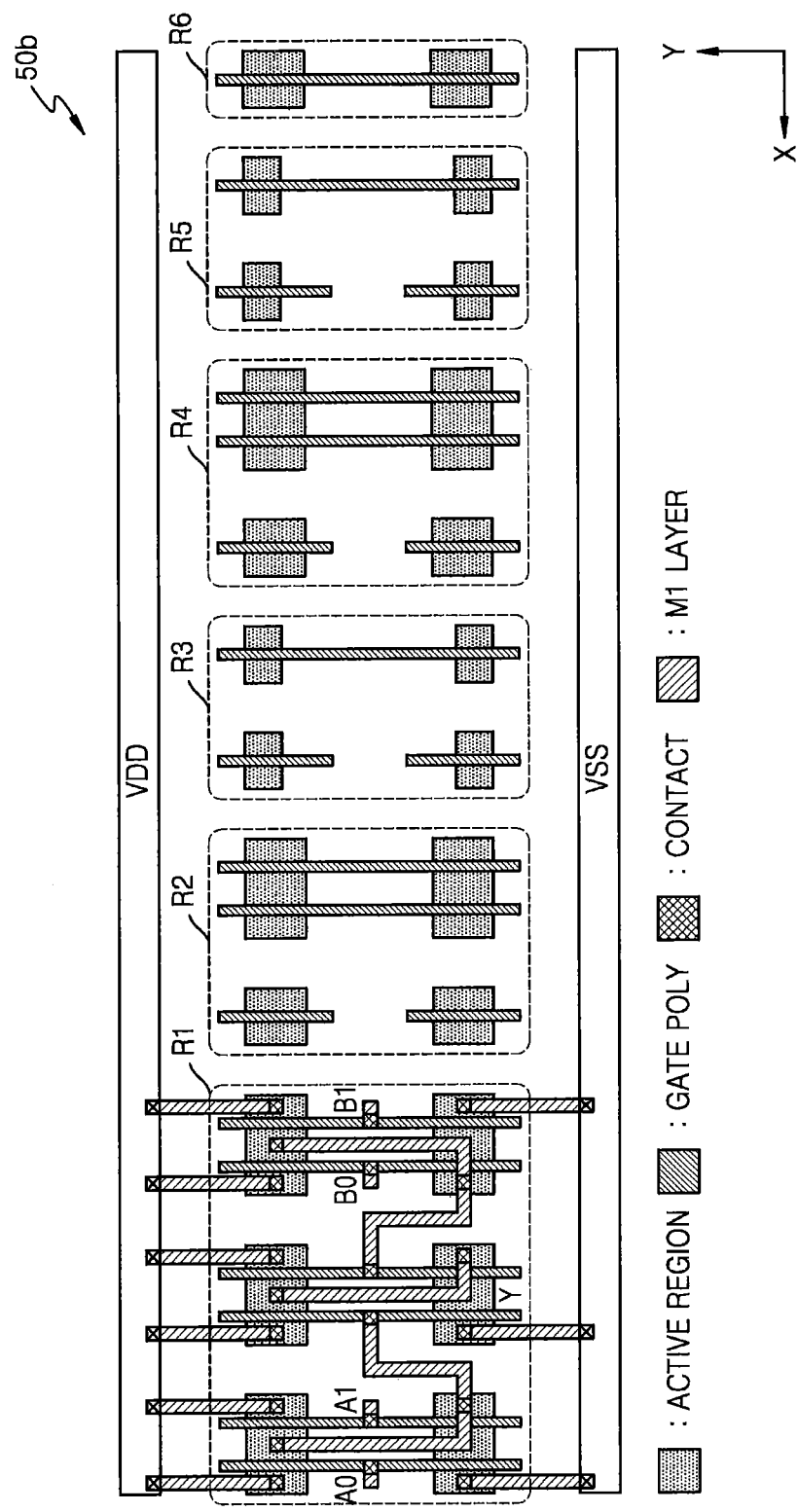

FIGS. 9A and 9B are respectively a logic diagram and layout diagram of an ECO functional cell that is configured with an AND-OR (AO) gate. Specifically, FIGS. 9A and 9B are respectively a logic diagram and layout diagram of an ECO functional cell obtained by reconfiguring the ECO base cell of FIGS. 5A and 5B.

As shown in FIG. 9A, in a circuit 50a corresponding to the reconfigured ECO functional cell, an AO gate having four inputs A0, A1, B0, and B1 and an output Y may be implemented by connecting three NAND gates included in a first group G1 to one another. Also, as shown in FIG. 9B, a layout 50b of an ECO functional cell corresponding to the AO gate may be formed by forming contacts, vias, and patterns of a first metal layer in the layout 10b of the ECO base cell of FIG. 5B. The layout 50b shown in FIG. 9B is only an example, and a layout corresponding to an AO gate may be formed by differently forming contacts, vias, and patterns of a first layer from those of FIG. 9B.

Figure 10A:
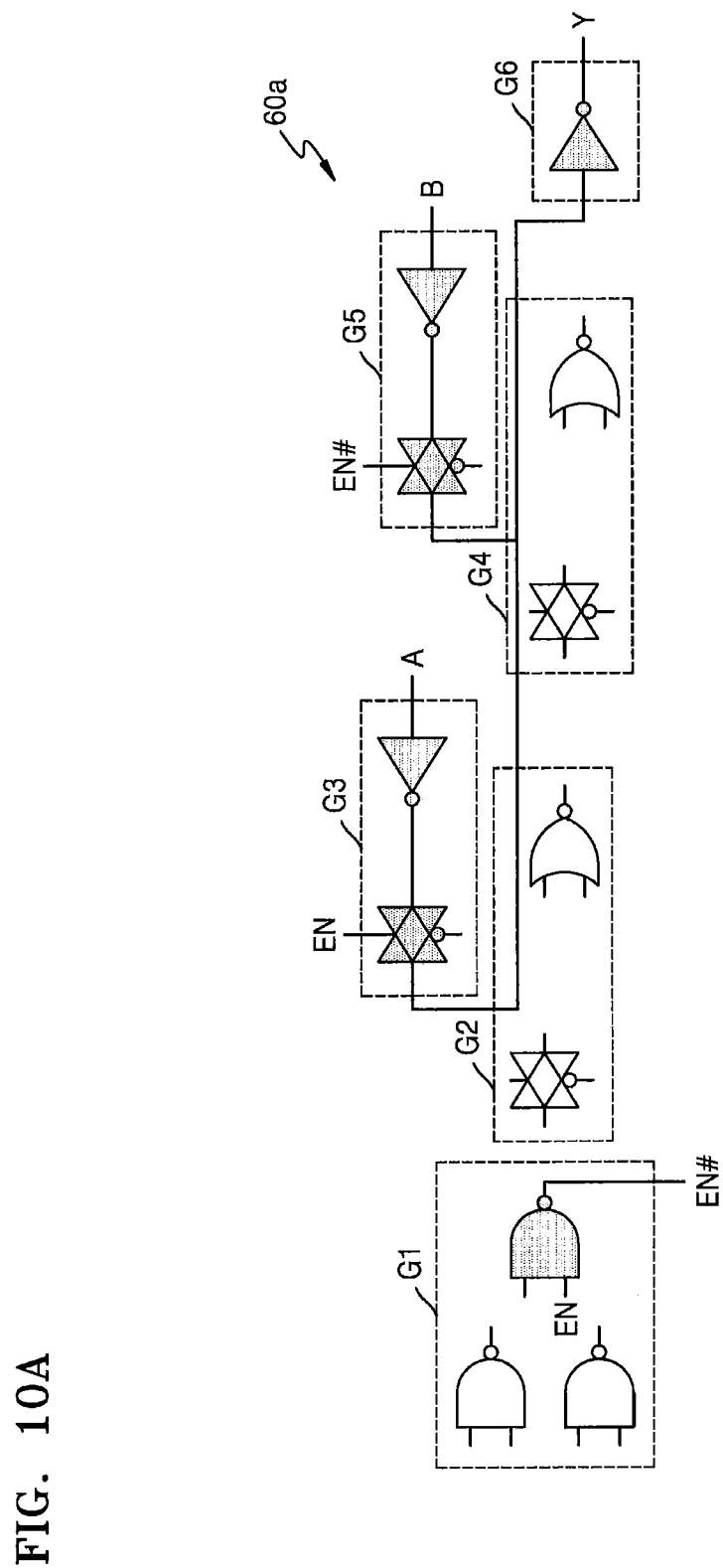
FIGS. 10A and 10B are respectively a logic diagram and layout diagram of an ECO functional cell that is reconfigured with a multiplexer (MUX)
Figure 10B:
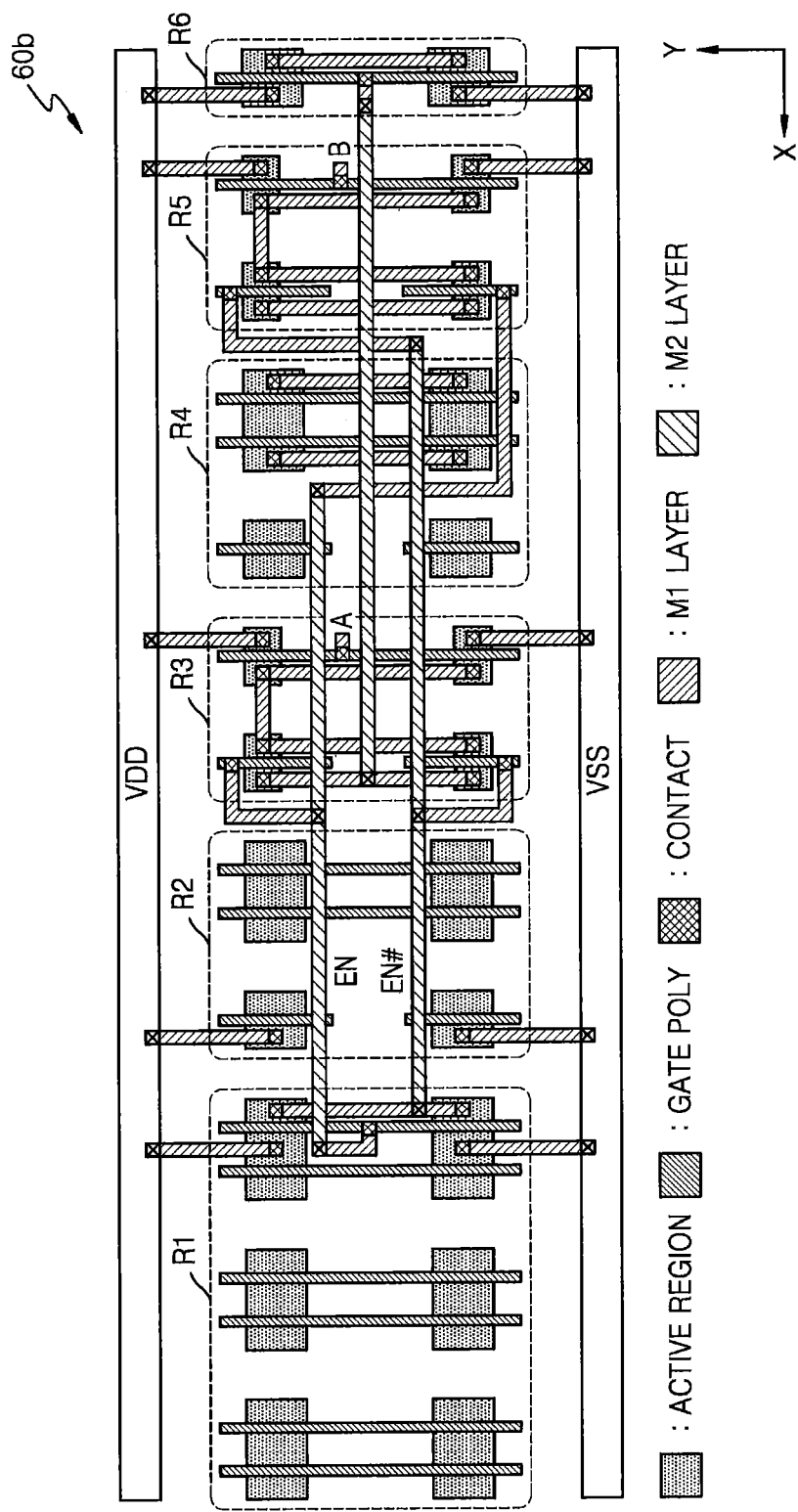

FIGS. 10A and 10B are respectively a logic diagram and layout diagram of an ECO functional cell reconfigured with a multiplexer MUX. Specifically, FIGS. 10A and 10B are respectively a logic diagram and layout diagram of an ECO functional cell obtained by reconfiguring the ECO base cell of FIGS. 5A and 5B.

As shown in FIG. 10A, in a circuit 60a corresponding to the reconfigured ECO functional cell, a multiplexer having three inputs A, B, and EN and an output Y may be implemented by connecting a NAND gate included in a first group G1, pass gates and inverters of third and fifth groups G3 and G5, and an inverter of a sixth group G6 to one another. In the circuit 60a of FIG. 10A, the NAND gate included in the first group G1 may be used as an inverter to invert a signal received via the enable input EN.

As shown in FIG. 10B, a layout 60b of the ECO functional cell corresponding to the multiplexer may be formed by forming contacts, vias, and patterns of first and second metal layers in a layout 10b of the ECO base cell of FIG. 5B. The layout 60b shown in FIG. 10B is only an example, and a layout corresponding to the multiplexer may be formed by forming different contacts, vias, and patterns of first and second metal layers from those of FIG. 10B.

Figure 11A:
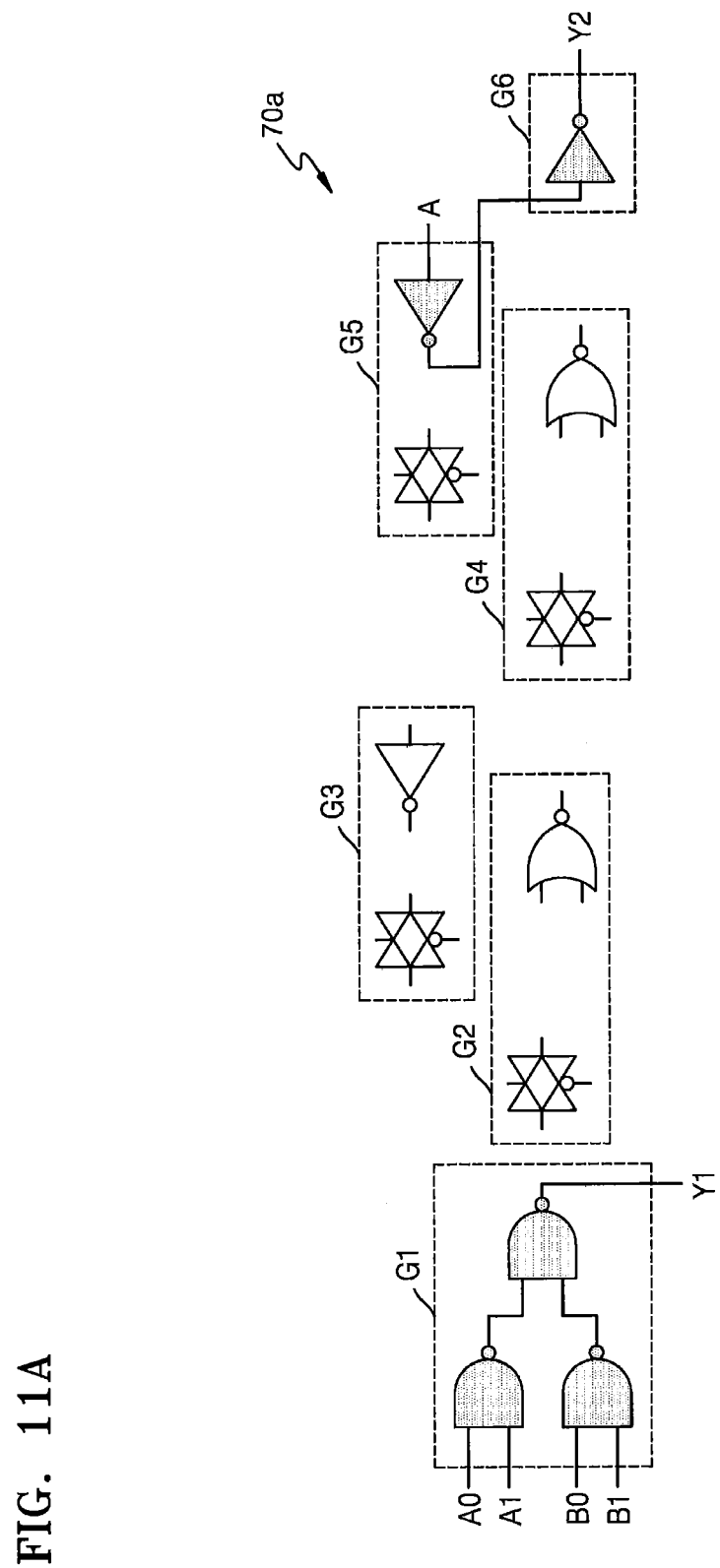
FIGS. 11A and 11B are respectively a logic diagram and layout diagram of an ECO functional cell that is reconfigured with two independent circuits.
Figure 11B:
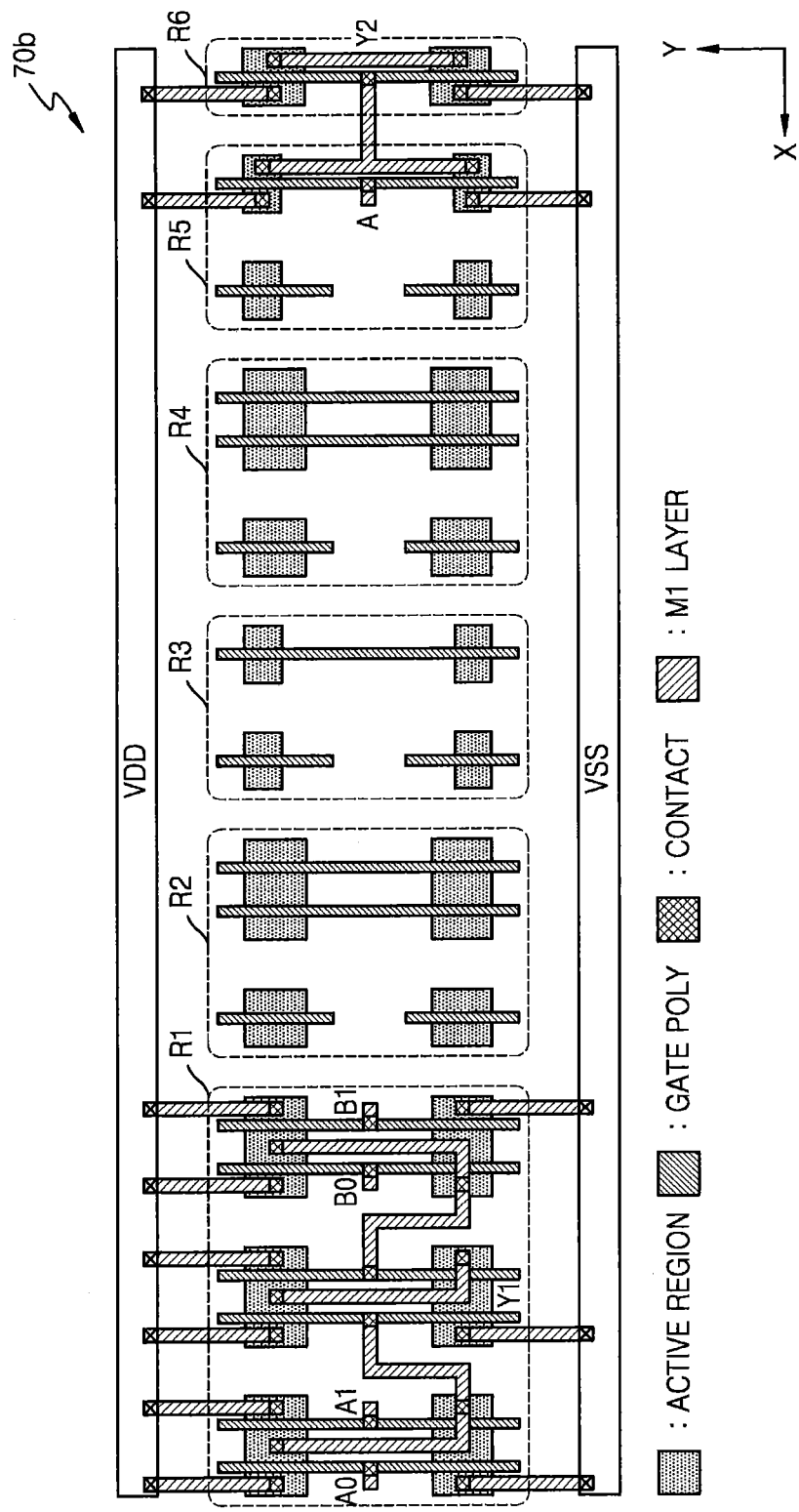

FIGS. 11A and 11B are respectively a logic diagram and layout diagram of an ECO functional cell reconfigured with two independent circuits. Specifically, FIGS. 11A and 11B are respectively a logic diagram and layout diagram of an ECO functional cell that is reconfigured with an AO gate and a buffer that are independent of each other.

In an exemplary embodiment, a circuit corresponding to the ECO functional cell may include at least two logic gates and include a first subcircuit and a second subcircuit, each of which may include at least one logic gate. The first and second subcircuits may be independent of each other. That is, the first and second subcircuits may be insulated from one another in the ECO functional cell. For example, as shown in FIG. 11A, a circuit 70a corresponding to a reconfigured ECO functional cell may be implemented by an AO gate and a buffer that are independent of each other. That is, the AO gate may have four inputs A0, A1, B0, and B1 and an output Y1, and the buffer may have an input A and an output Y2. Inputs and outputs of the AO gate may not be connected to inputs and outputs of the buffer in the ECO functional cell. A designer or a semiconductor design tool may increase usability of an ECO base cell and optimally redesign an IC by independently using a plurality of gates provided by the ECO base cell.

As shown in FIG. 11B, contacts, vias, and patterns of a first metal layer may be formed in the layout 10b of the ECO base cell of FIG. 5B, thereby forming a layout 70b of an ECO functional cell corresponding to an AO gate and a buffer, which are independent of each other. The layout 70b shown in FIG. 11B is only an example, and a layout corresponding to the AO gate and the buffer, which are independent of each other, may be formed by differently forming contacts, vias, and patterns of first and second metal layers from those of FIG. 11B.

Figure 12:
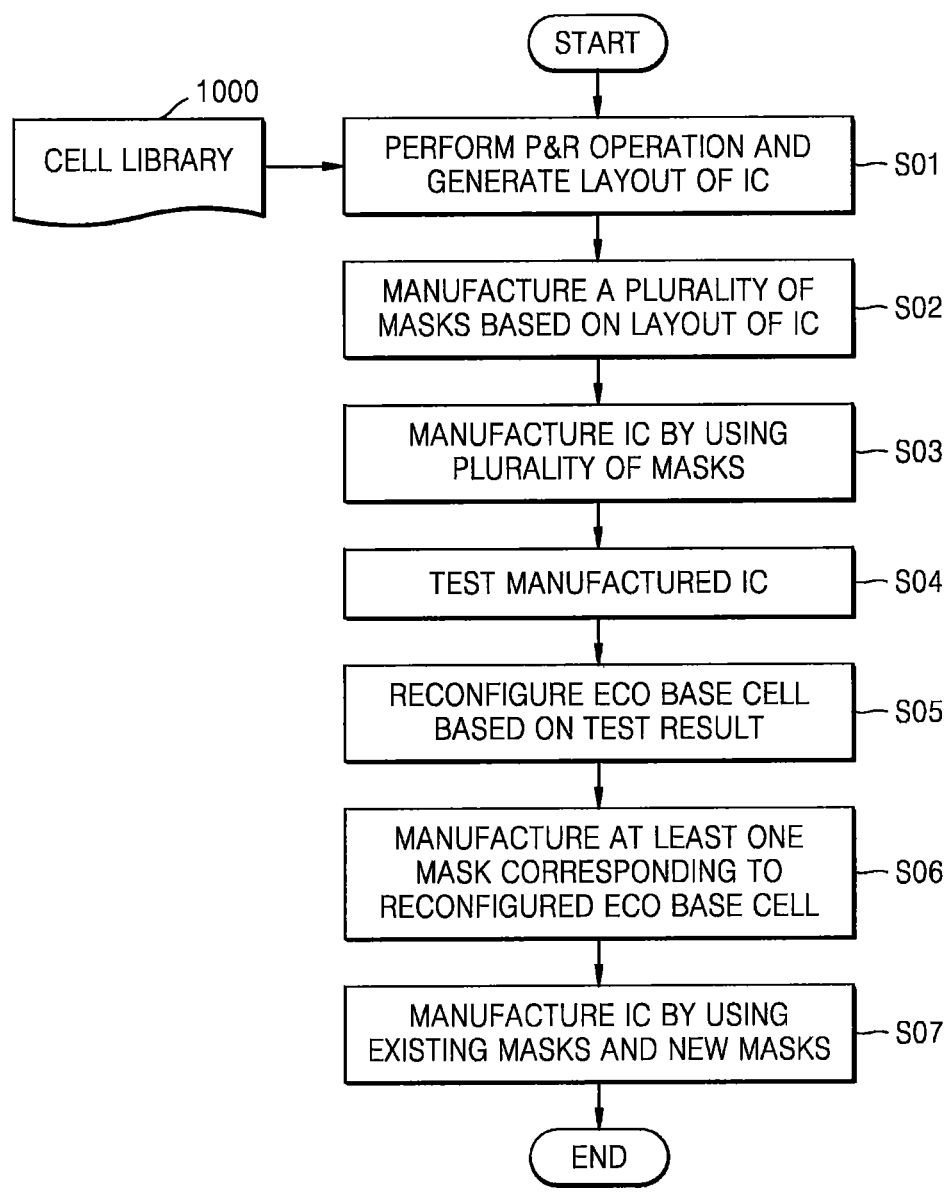
FIG. 12 is a flowchart of a method of manufacturing an IC according to an exemplary embodiment.

FIG. 12 is a flowchart of a method of manufacturing an IC according to an exemplary embodiment. Specifically, FIG. 12 illustrates a method of manufacturing the IC, redesigning the manufactured IC, and manufacturing the redesigned IC. In operation S01, an operation of performing a Place and Route (P&R) process and generating a layout of the IC may be performed. For example, a semiconductor design tool may refer a cell library 1000 and generate the layout of the IC by using a netlist of the IC based on information of standard cells included in the cell library 1000 and information of ECO base cells. The semiconductor design tool may place the ECO base cells in a space region in which the standard cells are not placed.

In operation S02, a plurality of masks may be manufactured based on the layout of the IC. For example, the layout of the IC may have a structure in which a plurality of layers are stacked, and at least one mask may be manufactured to form a shape in each of the plurality of layers.

In operation 803, an IC may be manufactured by using the plurality of masks. For example, each of a plurality of layers included in the IC may be formed in a desired shape by performing a deposition process, an etching process, and an implantation process by using the plurality of masks.

In operation S04, an operation of testing the manufactured IC may be performed. For example, the IC may be mounted on a test board or connected to a signal generator, a signal analyzer, or a logic analyzer to detect functional errors of the IC or measure performance of the IC.

In operation S05, an operation of reconfiguring the ECO base cell based on a test result may be performed. For example, a designer or a semiconductor design tool may reconfigure the ECO base cell to correct the functional errors or overcome performance limits. In an exemplary embodiment, the ECO base cell may have a layout that is generated based on a layout of a cell corresponding to a circuit including a plurality of logic gates. Thus, the ECO base cell may have high usability and provide high performance.

In operation S06, at least one mask corresponding to the reconfigured ECO base cell may be manufactured. For example, when the ECO base cell is reconfigured by defining a pattern of a first metal layer and a via in the ECO base cell, at least one new mask may be manufactured to form the pattern of the first metal layer and the via.

In operation S07, an IC may be manufactured by using the original masks and the reconfigured mask(s). The masks manufactured in operation S03, except the at least one reconfigured "new" mask manufactured in operation S06, may be reused so that manufacturing costs of masks consumed to manufacture the redesigned IC may be reduced. As a result, manufacturing costs of the redesigned IC may be reduced.

Figure 13:
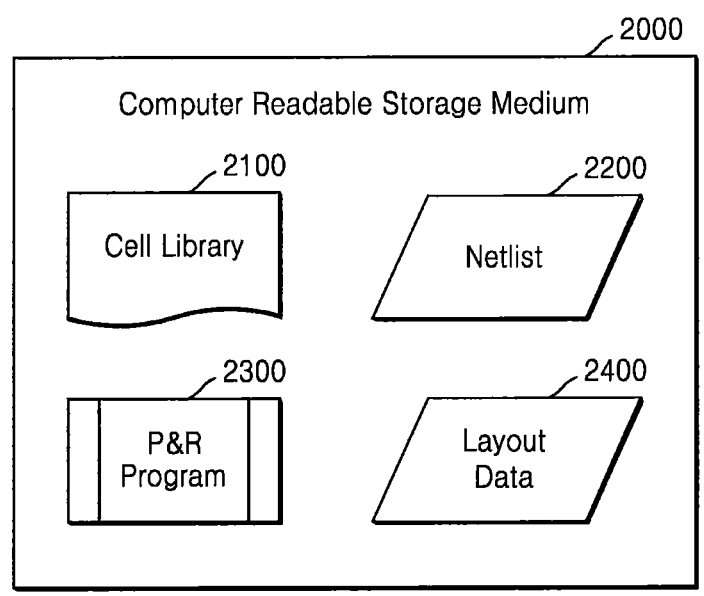
FIG. 13 is a block diagram of a computer-readable storage medium according to an exemplary embodiment.

FIG. 13 is a block diagram of a computer-readable storage medium 2000 according to an exemplary embodiment. Referring to FIG. 13, the computer-readable storage medium 2000 may include a cell library 2100, a netlist 2200, a placing and routing (P&R) program 2300, and layout data 2400. Although FIG. 13 illustrates an example in which the cell library 2100, the netlist 2200, the P&R program 2300, and the layout data 2400 are stored in one storage medium 2000, the inventive concept is not limited thereto. In some exemplary embodiments, the cell library 2100, the netlist 2200, the P&R program 2300, and the layout data 2400 may be respectively stored in different storage media.

The computer-readable storage medium 2000 may include an arbitrary storage medium that may be read by a computer while being used to provide commands and/or data to the computer. For example, the computer-readable storage medium 2000 may include a magnetic or optical medium, such as a disc, a tape, CD-ROM, DVD-ROM, CD-R, CD-RW, DVD-R, or DVD-RW, a volatile or non-volatile memory, such as RAM, ROM, or flash memory, a non-volatile memory that may be accessed via a universal serial bus (USB) interface, and a microelectromechanical systems (MEMS). The computer-readable storage medium 2000 may be inserted into a computer, integrated in the computer, or combined with the computer via a communication medium, such as a network and/or a wireless link.

The cell library 2100 may include information of a plurality of standard cells used to generate layout data 2400 of an IC by using the netlist 2200 of the IC and information of at least one ECO base cell. For example, the cell library 2100 may include functional information of standard cells, timing information, and topological information of a layout and also include topological information of a layout of the at least one ECO base cell. In an exemplary embodiment, the cell library 2100 may include information of at least one ECO base cell having a layout that is generated based on a layout of a cell corresponding to a circuit including a plurality of logic gates.

The netlist 2200 may include information defining a function of the IC, for example, standard cells and information of connection of the standard cells, and the layout data 2400 may include information (e.g., GDSII) indicating sizes and locations of features on the substrate. The IC or a semiconductor device including the IC may be manufactured based on the layout data 2400 by using a semiconductor process.

The P&R program 2300 may refer to the cell library 2100 and generate the layout data 2400 by using the netlist 2200. For example, the P&R program 2300 may place the standard cells on the substrate and place the at least one ECO base cell in a region (i.e., a spare region) in which the standard cells are not placed.

Figure 14:
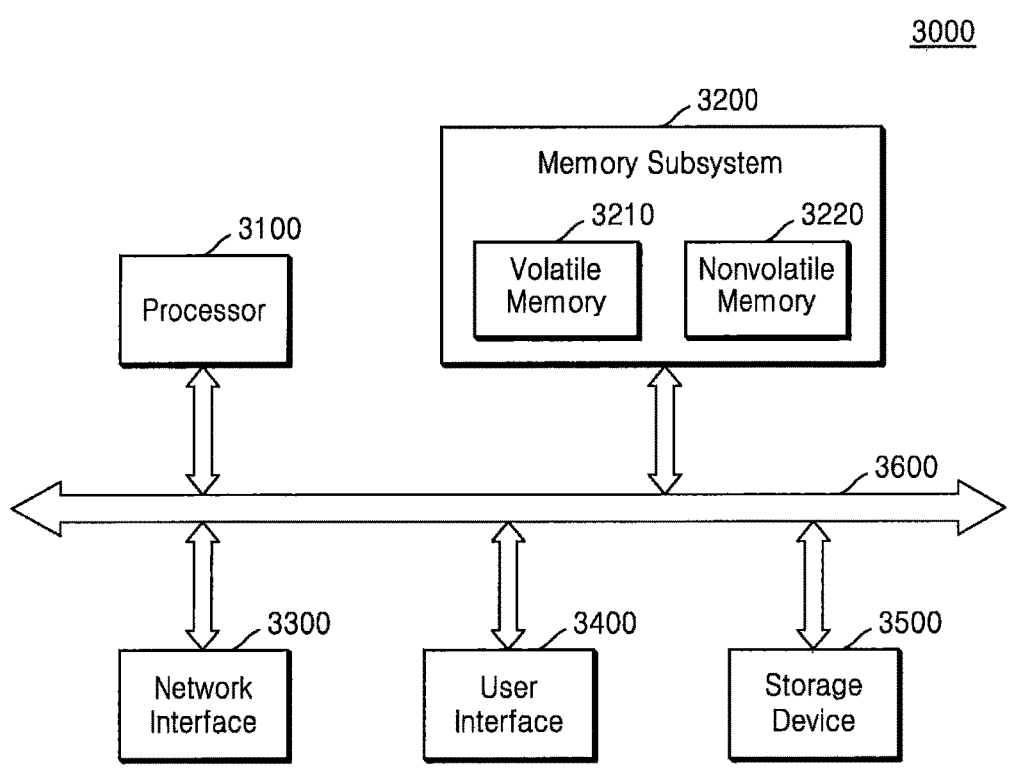
FIG. 14 is a block diagram of a computing system according to an exemplary embodiment.

FIG. 14 is a block diagram of a computing system 3000 according to an exemplary embodiment. As shown in FIG. 14, the computing system 3000 may include a processor 3100, a memory subsystem 3200, a network interface 3300, a user interface 3400, and a storage device 3500, which may communicate with one another via a bus 3600.

The processor 3100 may be configured to execute commands for performing the operations according to the embodiments as described above. For example, the processor 3100 may refer to a cell library and perform a plurality of commands for an operation of generating layout data by using a netlist. Also, the processor 3100 may perform a plurality of commands for an operation of generating a layout of an ECO functional cell configured to implement a desired function based on a layout of an ECO base cell. According to the present embodiment, the processor 3100 may execute an arbitrary instruction set (e.g., Intel architecture-32 (IA-32), 64-bit expansion IA-32, x86-64, PowerPC, Sparc, Microprocessor without Interlocked Pipeline Stages (MIPS), Advanced RISC Machines (ARM), and IA-64). Also, the computing system 3000 may include at least one processor.

The memory subsystem 3200 may include a volatile memory 3210 and a non-volatile memory 3220. Each of the volatile memory 3210 and the non-volatile memory 3220 may include an arbitrary type of memory device. For example, the volatile memory 3210 may include dynamic random access memory (DRAM), static RAM (SRAM), mobile DRAM, double data rate synchronous DRAM (DDR SDRAM), low power DDR (LPDDR) SDRAM, graphic DDR (GDDR) SDRAM, and/or Rambus dynamic random access memory (RDRAM). Also, the non-volatile memory 3220 may include electrically erasable programmable read-only memory (EEPROM), flash memory, phase-change random access memory (PRAM), resistive RAM (RRAM), nano-floating gate memory (NFGM), polymer RAM (PoRAM), magnetic RAM (MRAM), and/or ferroelectric RAM (FRAM). Although not shown, to provide an interface for the memory subsystem 3200, a memory controller may be included in the computing system 3000 and/or the processor 3100.

The memory subsystem 3200 may store information of the above-described ECO base cell or store commands for executing at least a portion of an operation of generating a layout of an IC by using the ECO base cell and/or data processed by the processor 3100. For example, the non-volatile memory 3220 may store a plurality of commands for enabling the processor 3100 to perform an operation of referring to the cell library and generating the layout of the IC based on the netlist and/or a plurality of commands for enabling the processor 3100 to perform an operation of generating the layout of the ECO functional cell having a desired function by using the layout of the ECO base cell. The volatile memory 3210 may store data generated during the above-described operations.

The network interface 3300 may provide an interface for an external network. For example, the external network may include a plurality of computing systems and a plurality of communication links, which may be connected to one another. The communication links may include wired links, optical links, wireless links, or arbitrary other types of links.

The user interface 3400 may provide an interface for users. The user interface 3400 may include an input device (e.g., a keyboard or a pointing device) and an output device (e.g., a display device and a printer). For example, the display device may provide a layout of a manufactured IC to a designer, and the input device may receive data for reconfiguring the EGO base cell (e.g., data regarding vias and patterns of a first metal layer) from the designer.

The storage device 3500 may include a storage medium capable of being attached to or detached from the computing system 3000. For example, the storage device 3500 may include the computer-readable storage medium 2000 as shown in FIG. 13. When the computing system 3000 operates, a portion (e.g., a netlist of an IC) of the data stored in the storage device 3500 may be transmitted to the memory subsystem 3200 via the bus 3600. Also, data (e.g., layout data) stored in the memory subsystem 3200 may be transmitted to the storage device 3500 under the control of the processor 3100, and the storage device 3500 may store the received data.

While the inventive concept has been particularly shown and described with reference to embodiments thereof, it will be understood that various changes in form and details may be made therein without departing from the spirit and scope of the following claims.

What is claimed is:

1. An integrated circuit (IC) comprising:
   an integrated circuit substrate;
   a plurality of standard cells on said integrated circuit substrate; and
   at least one engineering change order (ECO) base cell on the integrated circuit substrate;
   wherein the ECO base cell has a layout that is generated based on a layout of a functional cell corresponding to a first circuit including a plurality of logic gates having different logic configurations relative to each other;
   wherein the layout of the ECO base cell includes a plurality of spaced-apart and dissimilar regions that are each associated with a respective one of the plurality of logic gates, with each of the plurality of dissimilar regions comprising a plurality of spaced-apart active regions and a plurality of gate lines overlapping the plurality of spaced-apart active regions; and
   wherein the plurality of gate lines are disposed asymmetrically on said integrated circuit substrate so that the gate lines within at least two of the plurality of dissimilar regions lack symmetry relative to each other and relative to an axis extending between the at least two of the plurality of dissimilar regions.

2. The IC of claim 1, wherein the ECO base cell has a layout obtained by removing a metal layer and/or a via connected to the metal layer from the layout of the functional cell corresponding to the first circuit.

3. The IC of claim 1, wherein the layout of the ECO base cell comprises at least three gate lines that are parallel to one another.

4. The IC of claim 1, further comprising an ECO functional cell having a layout obtained by adding a pattern of a metal layer and a via connected to the pattern to the layout of the ECO base cell.

5. The IC of claim 4, wherein the ECO functional cell corresponds to a second circuit including at least one of the plurality of logic gates.

6. The IC of claim 5, wherein the second circuit is identical with the first circuit.

7. The IC of claim 5, wherein the second circuit comprises at least two logic gates, wherein the second circuit comprises first and second subcircuits, each of which comprises at least one of the at least two logic gates, and
the first and second subcircuits are insulated from each other in the ECO functional cell.

8. The IC of claim 1, wherein the ECO base cell is a filler cell or a decoupling capacitor cell placed in a spare region of a layout of the IC.

9. The IC of claim 1, wherein the functional cell is a standard cell.

10. An integrated circuit device, comprising:
    a plurality of interconnected standard logic cells distributed within a standard cell region on an integrated circuit substrate; and
    at least a first engineering change order (ECO) base cell within a spare region of the substrate extending adjacent the standard cell region, said first ECO base cell comprising a plurality of logic cells and having an in-substrate layout corresponding to an in-substrate layout of a functional logic cell and an above-substrate layout that is incomplete relative to an above-substrate layout of the functional logic cell;
    wherein the at least a first ECO base cell includes a plurality of spaced-apart and dissimilar regions that are each associated with a respective one of the plurality of logic gates, with each of the plurality of dissimilar regions comprising a plurality of spaced-apart active regions and a plurality of gate lines overlapping the plurality of spaced-apart active regions; and
    wherein the plurality of gate lines are disposed asymmetrically on the integrated circuit substrate so that the gate lines within at least two of the plurality of dissimilar regions lack symmetry relative to each other and relative to an axis extending between the at least two of the plurality of dissimilar regions.

11. The device of claim 10, wherein the above-substrate layout of said first ECO base cell is missing at least one electrically conductive via and/or at least one metal interconnect relative to the above-substrate layout of the functional logic cell.

12. The device of claim 11, wherein said first ECO base cell is configured to be functionally and layout equivalent to the functional logic cell upon addition of the missing at least one electrically conductive via and/or the at least one metal interconnect to said first ECO base cell.

13. The device of claim 10, wherein said first ECO base cell is configured to comprise a decoupling capacitor.

14. The device of claim 11, wherein the functional logic cell is equivalent to a standard logic cell in said plurality of interconnected standard logic cells.

* * * * *